(12) United States Patent
Lee et al.

(10) Patent No.: US 10,608,024 B2
(45) Date of Patent: Mar. 31, 2020

(54) DISPLAY APPARATUS

(71) Applicant: Samsung Display Co., Ltd., Yongin-Si, Gyeonggi-Do (KR)

(72) Inventors: Sangwol Lee, Yongin-si (KR); Sungku Kang, Yongin-si (KR); Jinkyu Kim, Yongin-si (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 16/204,794

(22) Filed: Nov. 29, 2018

(65) Prior Publication Data

US 2019/0172855 A1 Jun. 6, 2019

Related U.S. Application Data

(63) Continuation of application No. 15/415,513, filed on Jan. 25, 2017, now Pat. No. 10,170,505.

(30) Foreign Application Priority Data

Jun. 2, 2016 (KR) ........................ 10-2016-0068856

(51) Int. Cl.
*H01L 27/12* (2006.01)
*H01L 51/52* (2006.01)
(Continued)

(52) U.S. Cl.
CPC .......... *H01L 27/1262* (2013.01); *H01L 24/29* (2013.01); *H01L 24/32* (2013.01);
(Continued)

(58) Field of Classification Search
CPC ............. H01L 27/1218; H01L 27/1262; H01L 27/1214; H01L 27/124
See application file for complete search history.

(56) References Cited

U.S. PATENT DOCUMENTS 9,214,640 B2 12/2015 Lee et al.
9,274,559 B2 3/2016 Prushinskiy et al.
(Continued)

FOREIGN PATENT DOCUMENTS

KR 10-2013-0076402 A 7/2013
KR 10-2015-0014713 A 2/2015

OTHER PUBLICATIONS

US 9,224,793 B1, 12/2015, Son et al. (withdrawn)*
European Search Report, Application No. 17170575.9, dated Oct. 9, 2017, pp. 1-7.

*Primary Examiner* — Grant S Withers
(74) *Attorney, Agent, or Firm* — Innovation Counsel LLP

(57) ABSTRACT

A display apparatus capable of reducing a defect rate during manufacturing and utilizing thereof, the display apparatus includes a substrate comprising a display area and a peripheral area outside the display area; a display unit over an upper surface of the substrate to correspond to the display area; and a protective film including a protective film base and an adhesive layer, the protective film being attached to the lower surface of the substrate by the adhesive layer, wherein the protective film base includes a first protective film base corresponding at least to the display area, and a second protective film base having physical properties that are different from physical properties of the first protective film base and corresponding to at least a part of the peripheral area.

20 Claims, 21 Drawing Sheets

(51) Int. Cl.
    *H01L 23/00*    (2006.01)
    *H01L 27/32*    (2006.01)
    *H01L 51/00*    (2006.01)

(52) U.S. Cl.
    CPC ........ *H01L 27/124* (2013.01); *H01L 27/1218* (2013.01); *H01L 51/5253* (2013.01); *H01L 27/3225* (2013.01); *H01L 27/3244* (2013.01); *H01L 27/3276* (2013.01); *H01L 51/0097* (2013.01); *H01L 2224/293* (2013.01); *H01L 2224/32145* (2013.01); *H01L 2224/32227* (2013.01); *H01L 2224/73203* (2013.01)

(56) References Cited

U.S. PATENT DOCUMENTS

| | | |
|---|---|---|
| 2010/0308335 A1 | 12/2010 | Kim et al. |
| 2013/0169515 A1 | 7/2013 | Prushinsky et al. |
| 2014/0042406 A1 | 2/2014 | Degner et al. |
| 2015/0036300 A1 | 2/2015 | Park et al. |
| 2016/0093685 A1 | 3/2016 | Kwon et al. |
| 2016/0035759 A1 | 4/2016 | Kwon et al. |
| 2016/0111682 A1 | 4/2016 | Kim et al. |
| 2016/0172427 A1* | 6/2016 | Lee ..................... H01L 27/3276 257/40 |
| 2016/0190503 A1* | 6/2016 | Chang ................. H01L 51/5253 257/40 |
| 2017/0092709 A1* | 3/2017 | Choi ................... H01L 27/3262 |
| 2017/0263887 A1 | 9/2017 | Han et al. |
| 2017/0271616 A1* | 9/2017 | Choi ................... H01L 51/5253 |
| 2017/0294609 A1 | 10/2017 | Namkung |
| 2017/0323779 A1* | 11/2017 | Um ..................... G02F 1/33711 |
| 2018/0047938 A1* | 2/2018 | Kishimoto ............ H01L 27/323 |
| 2018/0090702 A1* | 3/2018 | Um ........................ H01L 51/56 |
| 2018/0151644 A1* | 5/2018 | Han ...................... G09G 3/3225 |
| 2018/0166652 A1* | 6/2018 | Kim ......................... B32B 7/12 |

* cited by examiner

DISPLAY APPARATUS

CROSS-REFERENCE TO RELATED APPLICATION

This application is a continuation application of U.S. patent application Ser. No. 15/415,513 filed Jan. 25, 2017, which claims priority under 35 USC § 119 to Korean Patent Application No. 10-2016-0068856, filed on Jun. 2, 2016, in the Korean Intellectual Property Office, the disclosure of which is incorporated herein in its entirety by reference.

BACKGROUND

1. Field

One or more embodiments relate to a display apparatus, and more particularly, to a display apparatus having a reduced defective ratio during manufacturing processes and utilization thereof.

2. Description of the Related Art

In general, a display apparatus includes a display unit on a substrate. In addition, a protective film is attached to a lower surface of the substrate.

However, according to a display apparatus of the prior art, defects may occur during manufacturing processes of the display apparatus or utilizing the manufactured display apparatus, or lifespan of the display apparatus may reduce due to a protective film attached to a lower surface of the substrate.

SUMMARY

One or more embodiments include a display apparatus having a reduced defective rate during manufacturing and utilizing the display apparatus.

Additional aspects will be set forth in part in the description which follows and, in part, will be apparent from the description, or may be learned by practice of the presented embodiments.

According to one or more embodiments, a display apparatus includes: a substrate including a display area and a peripheral area outside the display area; a display unit over an upper surface of the substrate to correspond to the display area; and a protective film including a protective film base and an adhesive layer, the protective film being attached to the lower surface of the substrate by the adhesive layer, wherein the protective film base includes a first protective film base corresponding at least to the display area, and a second protective film base having physical properties that are different from physical properties of the first protective film base and corresponding to at least a part of the peripheral area.

The second protective film base may have a light transmittance that is greater than a light transmittance of the first protective film base.

The first protective film base may have a thermal resistance that is greater than a thermal resistance of the second protective film base. The first protective film base may have a heat deformation temperature that is higher than a heat deformation temperature of the second protective film base.

The display apparatus may further include an electronic device or a printed circuit board over the upper surface of the substrate so as to correspond to an electronic device area included in the peripheral area, wherein the second protective film base may correspond at least to the electronic device area.

The second protective film base may extend to an edge of the substrate facing away from the display area.

A first end portion of the first protective film base in a direction to the electronic device area may be in surface-contact with a second end portion of the second protective film base in a direction to the display area. The first end portion and the second end portion may correspond to an edge of the display area in the direction to the electronic device area. The first end portion and the second end portion may correspond to an edge of the electronic device area in the direction to the display area.

A first end portion of the first protective film base in a direction to the electronic device area may correspond to an edge of the display area in a direction to the electronic device area.

A second end portion of the second protective film base in a direction to the display area may correspond to an edge of the electronic device area in a direction to the display area.

A first end portion of the first protective film base in a direction to the electronic device area may be spaced apart from a second end portion of the second protective film base in a direction to the display area. The adhesive layer may include a first adhesive layer corresponding to the first protective film base and a second adhesive layer corresponding to the second protective film base, and an end portion of the first adhesive layer in the direction to the electronic device area may be spaced apart from an end portion of the second adhesive layer in the direction to the display area.

The adhesive layer may include a first adhesive layer corresponding to the first protective film base and a second adhesive layer having a physical property different from a physical property of the first adhesive layer and corresponding to the second protective film base.

The peripheral area may include a bending area and the substrate is bent at the bending area. The first protective film base may correspond to the bending area.

A part of the first protective film base corresponding to the bending area may be at least partially removed.

A part of the first protective film base corresponding to the bending area may include a plurality of openings or a plurality of grooves.

Each of the plurality of openings or each of the plurality of grooves may extend from the display area toward the peripheral area in a virtual curved surface that is in parallel with the upper surface of the substrate that is bent. From among the plurality of openings or the plurality of grooves, openings or grooves locating at a center portion of the bending area may have areas that are greater than areas of openings or grooves locating near edges of the bending area.

Inner side surfaces of the plurality of openings or the plurality of grooves may be non-perpendicular to the upper surface of the substrate.

A portion of the first protective film base, wherein the portion includes the plurality of openings or the plurality of grooves, may have an area that is less than an area of the bending area. A portion of the first protective film base, wherein the portion may include the plurality of openings or the plurality of grooves, may have an area that is equal to an area of the bending area. A portion of the first protective film base, wherein the portion includes the plurality of openings or the plurality of grooves, may have an area that is greater than an area of the bending area.

The second protective film base may correspond to the bending area and an adjacent portion to the bending area.

A part of the second protective film base corresponding to the bending area may be at least partially removed.

A part of the second protective film base corresponding to the bending area may include a plurality of openings or a plurality of grooves. Each of the plurality of openings or each of the plurality of grooves may extend from the display area toward the peripheral area in a virtual curved surface that is in parallel with the upper surface of the substrate that is bent. From among the plurality of openings or the plurality of grooves, openings or grooves locating at a center portion of the bending area may have areas that are greater than areas of openings or grooves locating near edges of the bending area.

The adhesive layer may include an opening corresponding to the bending area. The opening may be filled with air. The protective film base may include an opening corresponding to the opening of the adhesive layer.

The adhesive layer may include a plurality of openings corresponding to the bending area. The first protective film base may correspond to the bending area, and the first protective film base may include a plurality of openings or a plurality of grooves corresponding to the plurality of openings of the adhesive layer. The second protective film base may correspond to the bending area and an adjacent portion to the bending area, and the second protective film base may include a plurality of openings or a plurality of grooves corresponding to the plurality of openings of the adhesive layer.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
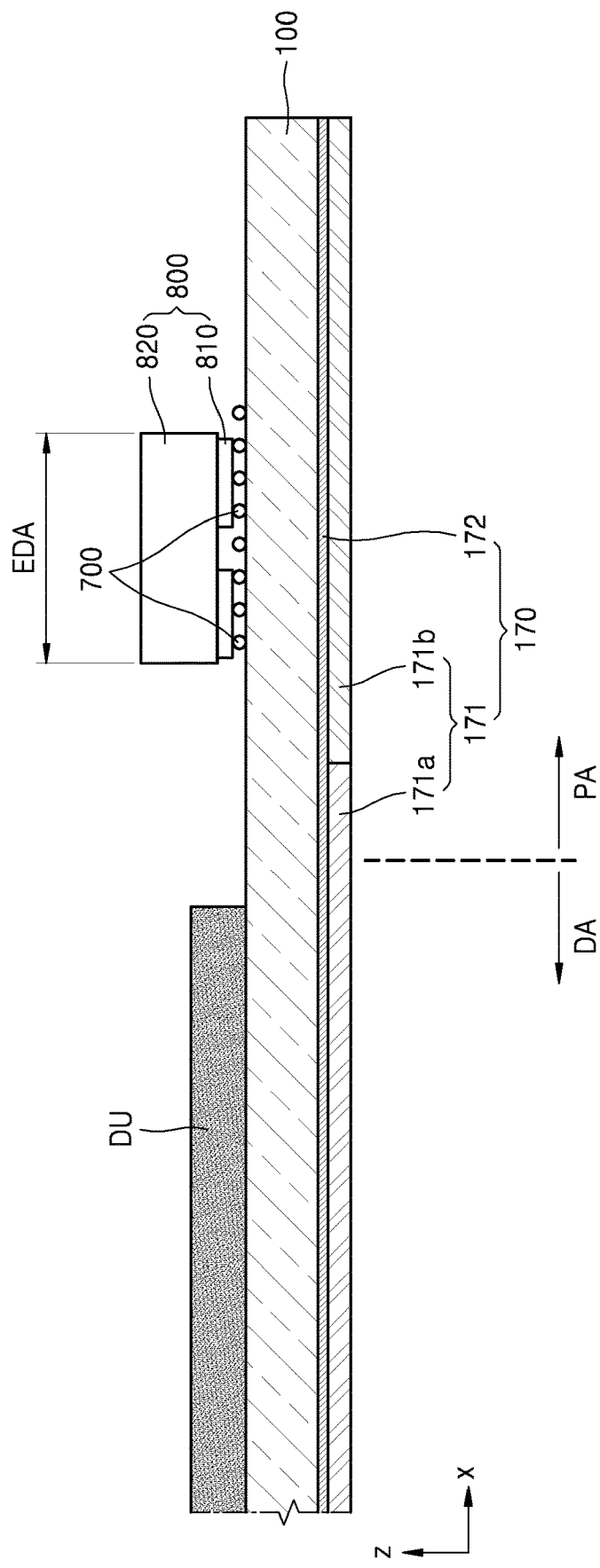
FIG. 1 is a schematic cross-sectional view of a part of a display apparatus according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

Hereinafter, the present disclosure will be described in detail by explaining example embodiments of the inventive concept with reference to the attached drawings. Like reference numerals in the drawings denote like elements.

Sizes of components in the drawings may be exaggerated for convenience of explanation. In other words, since sizes and thicknesses of components in the drawings are arbitrarily illustrated for convenience of explanation, the following embodiments are not limited thereto.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

FIG. 1 is a schematic cross-sectional view of a display apparatus according to an embodiment. As shown in FIG. 1, the display apparatus according to the embodiment includes a substrate 100, a display unit DU, and a protective film 170.

The substrate 100 includes a display area DA and a peripheral area PA outside the display area DA. The substrate 100 may include various materials having flexible or bendable characteristics, e.g., polymer resins such as polyethersulphone (PES), polyacrylate (PAR), polyetherimide (PEI), polyethylene naphthalate (PEN), polyethylene terephthalate (PET), polyphenylene sulfide (PPS), polyarylate, polyimide (PI), polycarbonate (PC), and cellulose acetate propionate (CAP). In addition, the substrate 100 may include a multi-layered structure in some embodiments.

The display unit DU is over an upper surface of the substrate (in the +z direction) so as to correspond to the display area DA. The display unit DU may include a display device such as an organic light-emitting device or a thin film transistor. Exemplary configurations of the display unit DU will be described with reference to later described embodiments.

The protective film 170 includes a protective film base 171 and an adhesive layer 172. The protective film 170 is attached to a lower surface of the substrate 100 (in −z direction) via the adhesive layer 172. That is, the protective film 170 is on a lower surface of the substrate 100 opposite (−z direction) to the display unit DU (+z direction). The adhesive layer 172 of the protective film 170 may include, for example, a pressure sensitive adhesive (PSA).

The protective film base 171 included in the protective film 170 with the adhesive layer 172 may include a first protective film base 171a and a second protective film base 171b. The first protective film base 171a and the second protective film base 171b may be at the same plane as each other. In addition, as shown in FIG. 1, the first protective film base 171a may correspond at least to the display area DA, and the second protective film base 171b may correspond at least to a part of the peripheral area PA. That is, the first protective film base 171a may have an area that is equal to or greater than that of the display area DA. In FIG. 1, the first protective film base 171a is shown to correspond to a part of the peripheral area PA, which is adjacent to the display area DA, as well as the display area DA.

In the protective film base 171 as above, the first protective film base 171a and the second protective film base 171b may have physical properties different from each other. In detail, a light transmittance of the second protective film base 171b may be greater than that of the first protective film base 171a. Also, a thermal resistance of the first protective film base 171a may be higher than that of the second protective film base 171b. In more detail, a heat deformation temperature, at which deformation occurs, of the first protective film base 171a may be higher than that of the second protective film base 171b.

As shown in FIG. 1, the display apparatus may further include an electronic device 800 such as a driver integrated circuit (IC). The electronic device 800 is on the peripheral area PA of the substrate 100. In detail, the electronic device 800 is arranged over the upper surface of the substrate 100 (in the +z direction) so as to correspond to an electronic device area (EDA) included in the peripheral area PA of the substrate 100. In FIG. 1, wires and/or pads over the upper surface of the substrate 100 (in the +z direction) are not shown for convenience of description, and the electronic device 800 may be electrically connected to the wires and/or pads that are not shown.

The electronic device 800 is attached onto the substrate 100 by an anisotropic conductive film (ACF). That is, conductive balls 700 included in the ACF contact the wires and/or pads on the substrate 100, and at the same time, contact bumps 810 are disposed under a body 820 of the electronic device 800 so as to electrically connect the wires and/or pads to the bumps 810. Accordingly, the electronic device 800 may be electrically connected to the wires and/or pads. Here, to check whether the electronic device 800 is electrically connected to the wires and/or pads, a pressure mark test may be performed. If the electronic device 800 is not properly connected to the wires and/or pads, this may cause defects in the display apparatus.

The pressure mark test may check, for example, a degree of broken conductive balls 700 due to a pressure applied when the electronic device 800 is mounted on the substrate 100. Breaking of the conductive balls 700 may denote that the conductive balls 700 are interposed between the bumps 810 of the electronic device 800 and the wires and/or pads on the substrate 100 and pressurized, and accordingly, it may be estimated that the electronic device 800 is electrically connected to the wires and/or pads on the substrate 100.

To perform the pressure mark test, a portion of the protective film 170 corresponding to the electronic device 800 may have a light transmitting property. That is, the protective film 170 has the portion having high transmittance correspond to the electronic device 800, so that status of the conductive balls 700 may be identified through the protective film 170 and the substrate 100. To do this, the second protective film base 171b, which corresponds at least to the electronic device area EDA on which the electronic device 800 is located, may be set to have high transmittance. Therefore, when the light transmittance of the second protective film base 171b is greater than that of the first protective film base 171a, and the substrate 100 also has the light transmitting property, the pressure mark test may be performed to determine whether the electronic device 800 is properly connected to the wires and/or pads on the substrate 100.

In addition, the display apparatus may undergo various reliability tests during manufacturing processes thereof. This is for evaluating, in advance during the manufacturing of the display apparatus, whether there would be problems when the display apparatus is used under various circumstances after being manufactured. The reliability tests may include, for example, evaluating whether the display apparatus is defective under a high temperature or whether the display apparatus is defective under a humid circumstance. Therefore, individual property of elements in the display apparatus may need to be maintained during the tests under the high temperature or the humid circumstance. In particular, if the display apparatus has a flexible property or a bendable property at the display area DA, degradation of the flexible or bendable property may need to be evaluated in the reliability tests.

To do this, a thermal resistance of the first protective film base 171a that corresponds to the display area DA may be improved. Therefore, the thermal resistance of the first protective film base 171a may be greater than that of the second protective film base 171b. In detail, the heat deformation temperature, at which deformation occurs, of the first protective film base 171a may be higher than that of the second protective film base 171b. As such, the portion of the protective film 170 that corresponds to the display area DA may not be deformed during the reliability tests.

Since the second protective film base 171b corresponds to an outer portion of the display area DA, even when the second protective film base 171b and flexibility of the second protective film base 171b degrades during the reliability tests, the flexible or bendable property of the display area DA may not degrade. Therefore, a user observing the display area DA would recognize the entire flexible or bendable property of the display apparatus as being maintained.

The protective film base 171 of the protective film 170 may include polyimide and polyethylene. In particular, the first protective film base 171a may include polyimide, and the second protective film base 171b may include polyethylene. Polyethylene generally has a higher light transmittance than that of polyimide. Therefore, the second protective film base 171b including polyethylene may have a higher light transmittance than that of the first protective film base 171a including polyimide. In addition, a heat deformation temperature of polyethylene is about 80° C., and a heat deformation temperature of polyimide is much higher than 80° C. Therefore, the first protective film base 171a including polyimide has a greater thermal resistance than that of the second protective film base 171b including polyethylene.

According to an embodiment, the protective film 170 covers the lower surface of the substrate 100 (in the −z direction) as much as possible so as to sufficiently protect the lower surface of the substrate 100 (in the −z direction). Therefore, as shown in FIG. 1, the second protective film base 171b may extend to an edge of the substrate 100 facing away from the display area DA (+x direction). In FIG. 1, an end surface of the substrate 100 in opposite direction to the display area DA flushes with an end surface of the second protective film base 171b.

Figure 2:
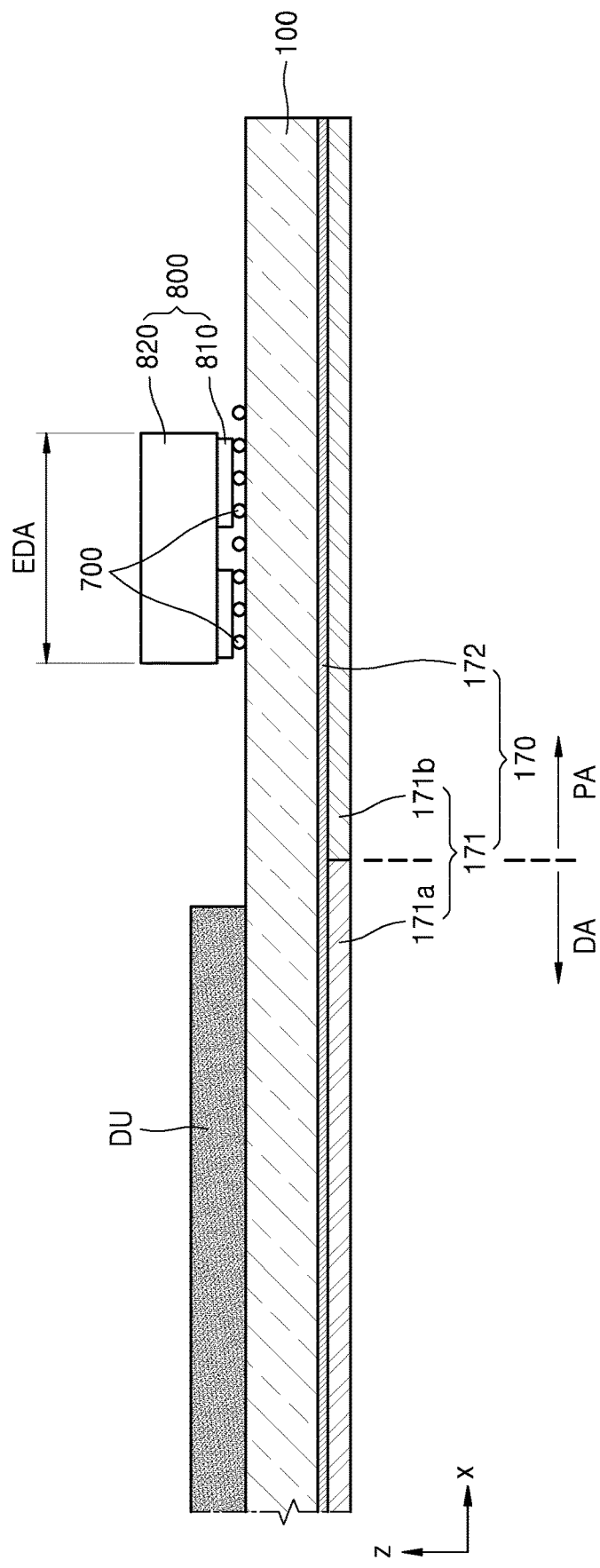
FIG. 2 is a schematic cross-sectional view of a part of a display apparatus according to an embodiment.
Figure 3:
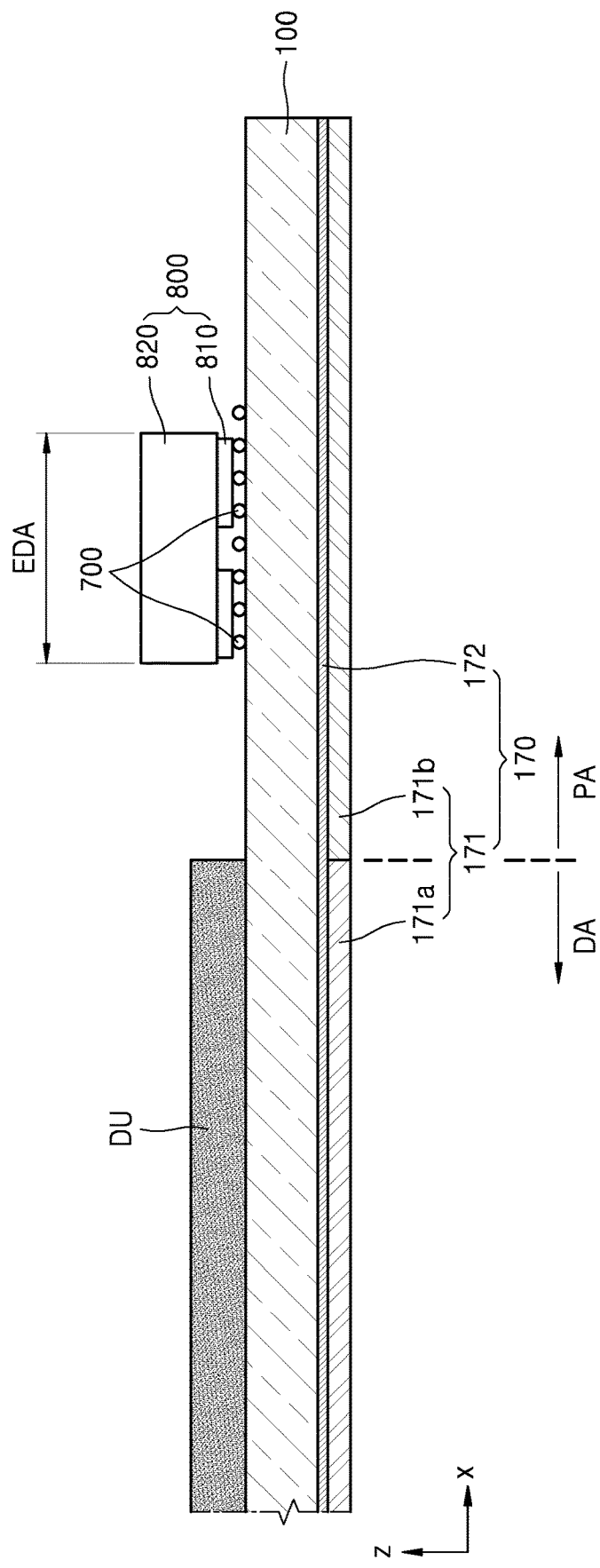
FIG. 3 is a schematic cross-sectional view of a part of a display apparatus according to an embodiment.

In addition, as shown in FIG. 1, a first end portion of the first protective film base 171a in a direction toward the electronic device area EDA (+x direction) may surface-contact a second end portion of the second protective film base 171b in a direction toward the display area DA (−x direction). As such, the protective film 170 may mostly protect the lower surface of the substrate 100. In this case, the first end portion and the second end portion may be located in the peripheral area PA as shown in FIG. 1, but are not limited thereto. That is, as shown in FIG. 2, which is a schematic cross-sectional view of a part of a display apparatus according to an embodiment, the first end portion and the second end portion may be located at a boundary between the display area DA and the peripheral area PA. In this case, the first end portion and the second end portion correspond to an edge of the display area DA in a direction toward the electronic device area EDA. In addition, FIG. 2 shows that the display area DA has an area greater than that of the display unit DU. In the case of FIG. 3, which is a schematic cross-sectional view of a part of a display apparatus according to an embodiment, an edge of the display area corresponds to an edge of the display unit DU, the first end portion and the second end portion may also be located at a boundary between the display area DA and the peripheral area PA.

Figure 4:
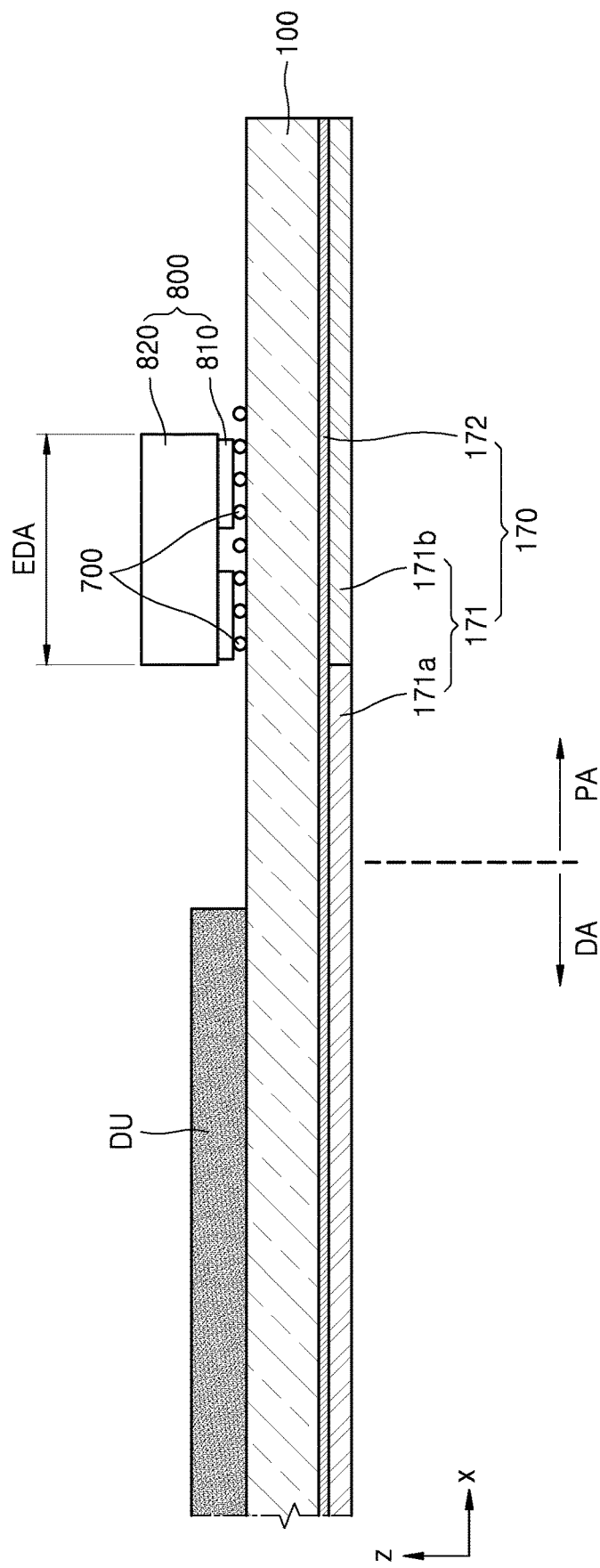
FIG. 4 is a schematic cross-sectional view of a part of a display apparatus according to an embodiment.

The second protective film base 171b having high light transmittance may correspond at least to the electronic device area EDA. Therefore, as shown in FIG. 4, which is a schematic cross-sectional view of a part of a display apparatus according to an embodiment, the first end portion and the second end portion may correspond to an edge of the electronic device area EDA in a direction toward the display area DA (−x direction). In this case, the pressure mark test for checking the mounting status of the electronic device 800 may be sufficiently performed via the second protective film base 171b having excellent light transmittance, and at the same time, the lower surface of the substrate 100 (in the −z direction) may be protected as much as possible by the first protective film base 171a having excellent thermal resistance.

Figure 5:
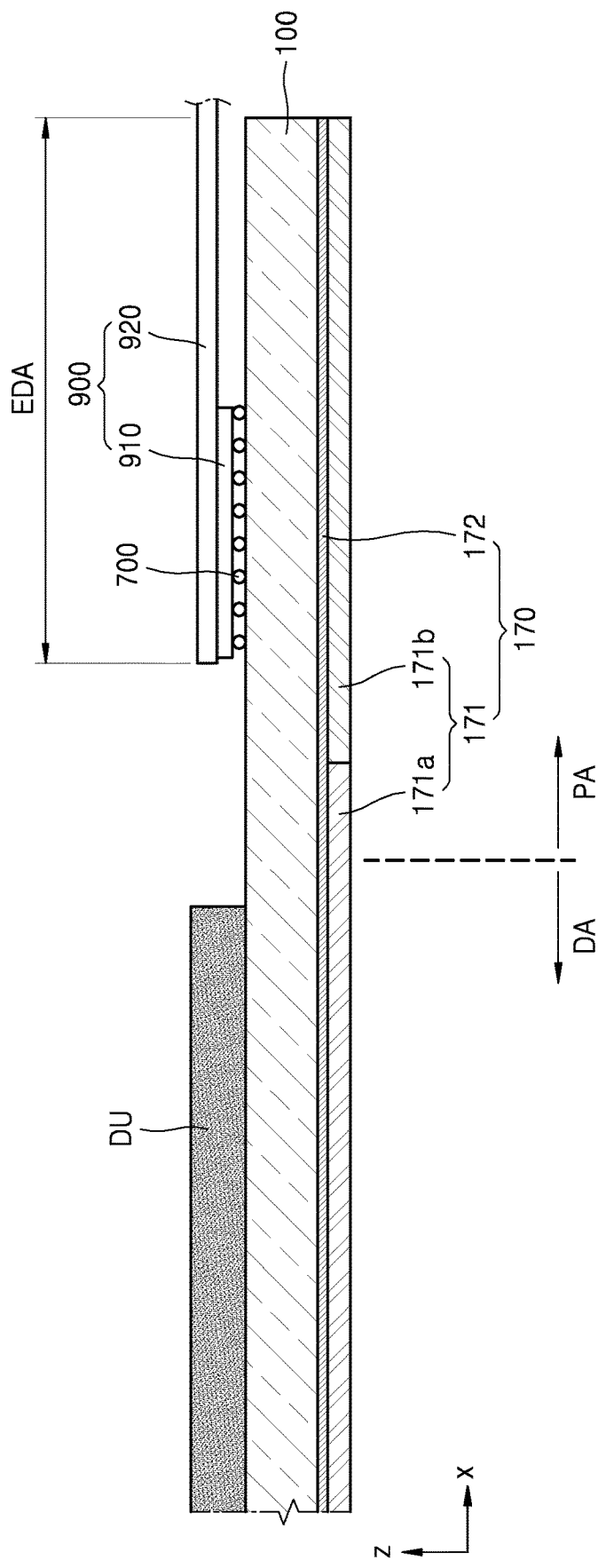
FIG. 5 is a schematic cross-sectional view of a part of a display apparatus according to an embodiment.

So far, the case in which the display apparatus includes the electronic device 800 is described as above, but one or more embodiments are not limited thereto. For example, as shown in FIG. 5, which is a schematic cross-sectional view of a part of a display apparatus according to an embodiment, the display apparatus may include a printed circuit board 900. The printed circuit board 900 is also attached onto the substrate 100 via an anisotropic conductive film. That is, the conductive balls 700 of the anisotropic conductive film contact the wires and/or pads (not shown) on the substrate 100, and at the same time, contact bumps 910 on a lower portion of a body 920 of the printed circuit board 900, so as to electrically connect the wires and/or pads to the bumps 910. Accordingly, the printed circuit board 900 may be electrically connected to the wires and/or pads.

In this case, the pressure mark test may also be performed to check whether the printed circuit board 900 is electrically connected to the wires and/or pads. To do this, at least the second protective film base 171b may correspond to the electronic device area EDA in which the printed circuit board 900 is located, and a portion of the protective film 170, which corresponds to the electronic device area EDA, that is, the second protective film base 171b may have excellent light transmittance. Therefore, the light transmittance of the second protective film base 171b may be greater than that of the first protective film base 171a. The printed circuit board 900 may extend to outside the substrate 100. Therefore, explaining that the printed circuit board 900 is located in the electronic device area EDA may be understood as explaining that a portion of the printed circuit board 900, which is electrically connected to the substrate 100, is located in the electronic device area EDA.

The display apparatus according to the embodiment of FIG. 5 may be also modified as described above with reference to FIGS. 2 to 4. That is, the first end portion of the first protective film base 171a in the direction toward the electronic device area EDA (+x direction) and the second end portion of the second protective film base 171b in the direction toward the display area DA (−x direction) may contact each other by surfaces, and the first and second end portions may be located at the boundary between the display area DA and the peripheral area PA as shown in FIG. 2. In addition, in FIG. 5, the display area DA is shown to have an area greater than that of the display unit DU. However, an edge of the display area DA may correspond to an edge of the display unit DU, and the first and second end portions may be located at the boundary between the display area DA and the peripheral area PA as shown in FIG. 3. The second protective film base 171b having an excellent light transmittance may correspond at least to the electronic device area EDA. Therefore, like the example shown in FIG. 4, the first and second end portions may correspond to the edge of the electronic device area EDA in the direction toward the display area DA (−x direction).

The display apparatus may include both the electronic device 800 and the printed circuit board 900, and in this case, the electronic device 800 and the printed circuit board 900 may be located in the electronic device area EDA. Here, that the printed circuit board 900 is located in the electronic device area EDA may denote that a portion of the printed circuit board 900, which is electrically connected to the substrate 100, is located in the electronic device area EDA.

Figure 6:
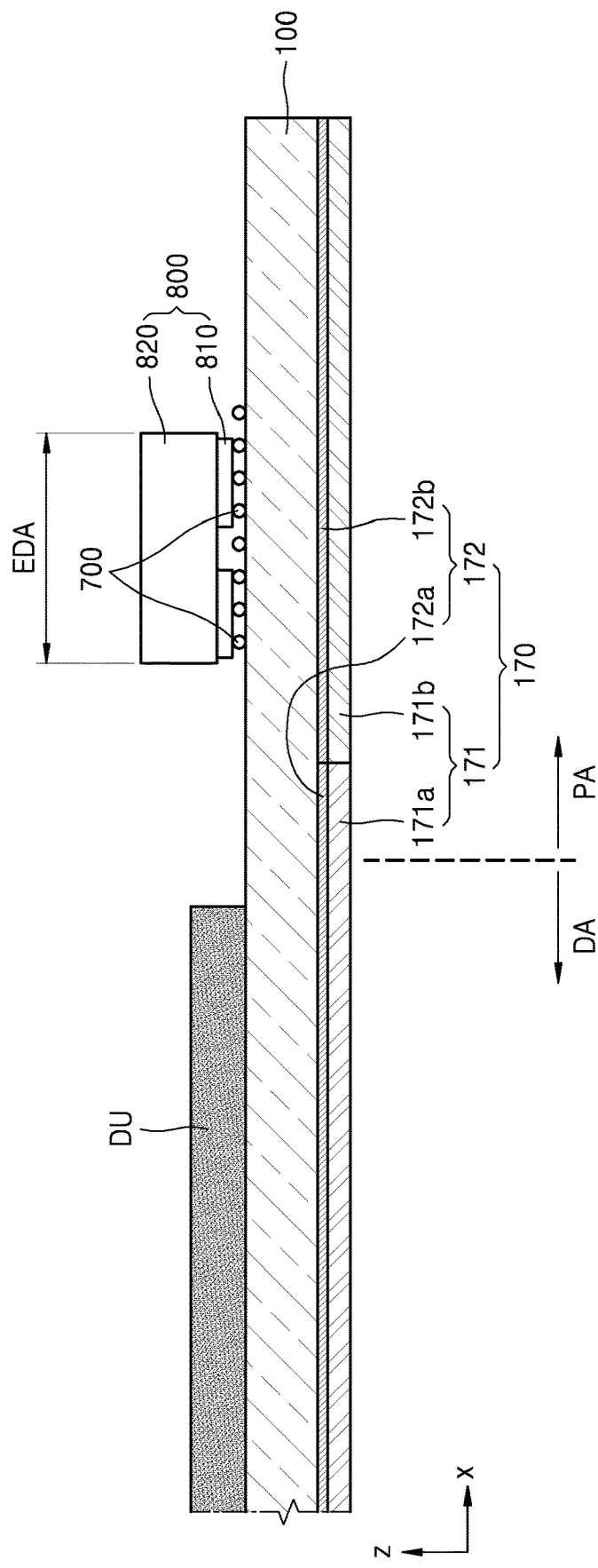
FIG. 6 is a schematic cross-sectional view of a part of a display apparatus according to an embodiment.

The case in which the protective film base 171 includes the first and second protective film bases 171a and 171b is described as above, but one or more embodiments are not limited thereto. For example, as shown in FIG. 6 that is a schematic cross-sectional view of a part of a display apparatus according to an embodiment, the adhesive layer 172 may also include a first adhesive layer 172a and a second adhesive layer 172b. In this case, the first adhesive layer 172a may correspond to the first protective film base 171a, and the second adhesive layer 172b may correspond to the second protective film base 171b. In addition, the first adhesive layer 172a and the second adhesive layer 172b may have different physical properties from each other.

For example, a light transmittance of the second adhesive layer 172b may be greater than that of the first adhesive layer 172a. Also, a thermal resistance of the first adhesive layer 172a may be greater than that of the second adhesive layer 172b. In more detail, a heat deformation temperature of the first adhesive layer 172a, at which deformation occurs, may be higher than that of the second adhesive layer 172b. This may be applied to the above-described embodiments and modified examples thereof, and also, to embodiments that will be described later and modified examples thereof.

Figure 7:
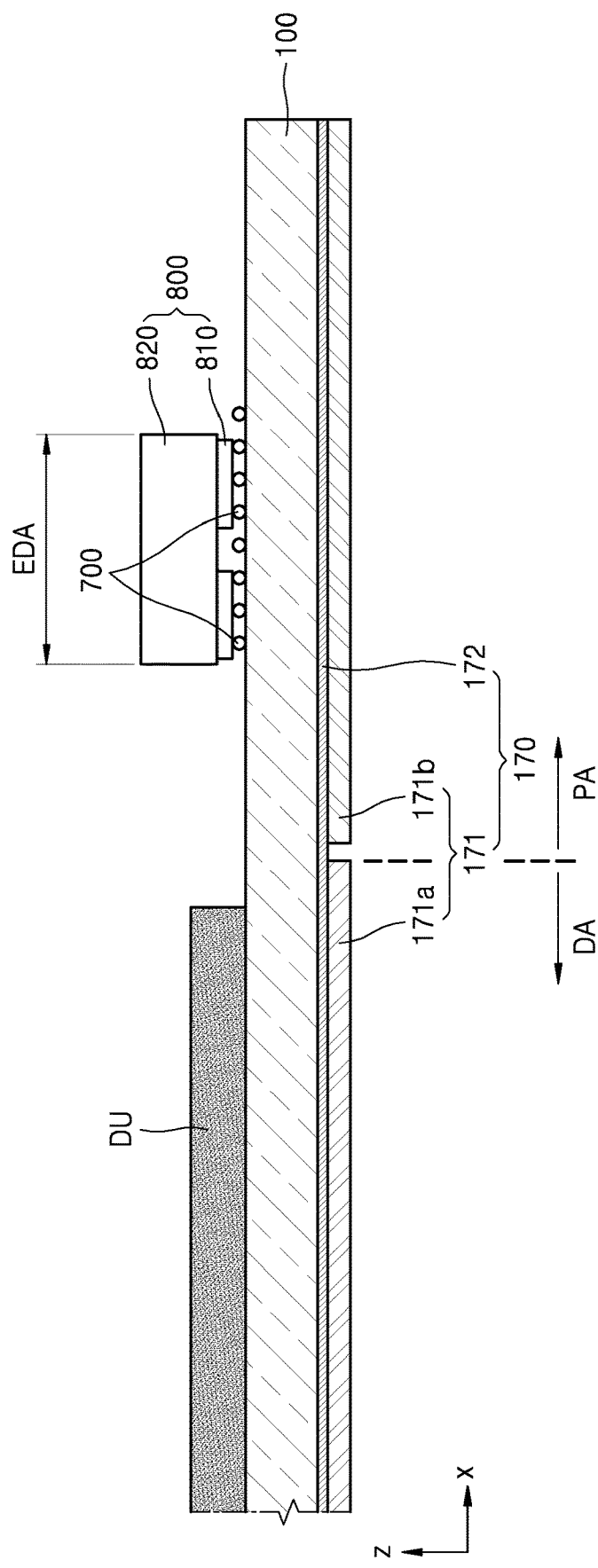
FIG. 7 is a schematic cross-sectional view of a part of a display apparatus according to an embodiment.

In addition, in FIGS. 1 to 6, the first end portion of the first protective film base 171a in the direction toward the electronic device area EDA (+x direction) and the second end portion of the second protective film base 171b in the direction toward the display area DA (-x direction) are shown to contact each other by surfaces, but are not limited thereto. As shown in FIG. 7, which is a schematic cross-sectional view of a part of a display apparatus according to an embodiment, the first protective film base 171a and the second protective film base 171b may be spaced apart from each other on at least a part. That is, the first end portion of the first protective film base 171a in the direction toward the electronic device area EDA (+x direction) and the second end portion of the second protective film base 171b in the direction toward the display area DA may be spaced apart from each other. In this case, the first end portion of the first protective film base 171a in the direction toward the second protective film base 171b may be located in the peripheral area PA, or at the boundary between the display area DA and the peripheral area PA. As such, the lower surface of the substrate 100 (in the -z direction) in the display area DA may be protected by the first protective film base 171a.

Figure 8:
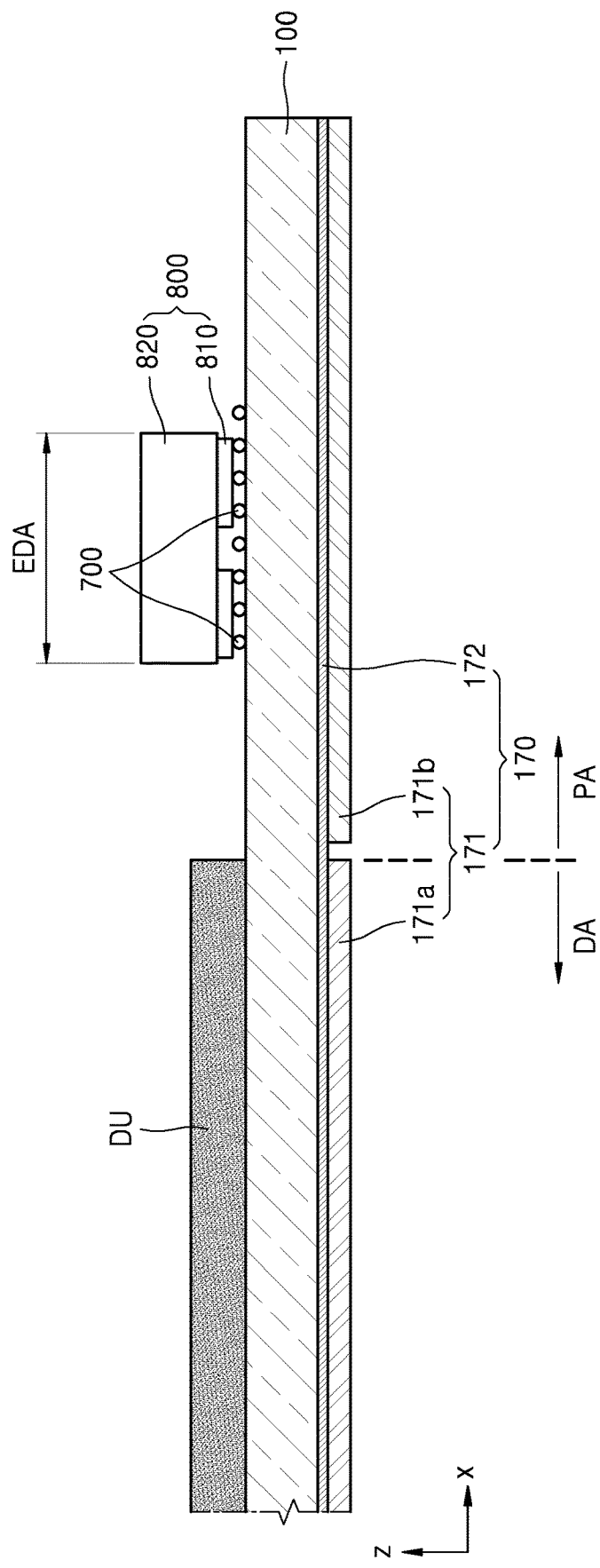
FIG. 8 is a schematic cross-sectional view of a part of a display apparatus according to an embodiment.

In addition, in FIG. 7, the display area DA is shown to have a greater area than that of the display unit DU. However, as shown in FIG. 8, which is a schematic cross-sectional view of a part of a display apparatus, an edge of the display area DA may correspond to an edge of the display unit DU. Also, according to an embodiment, the first end portion may be located at a boundary between the display area DA and the peripheral area PA.

Figure 9:
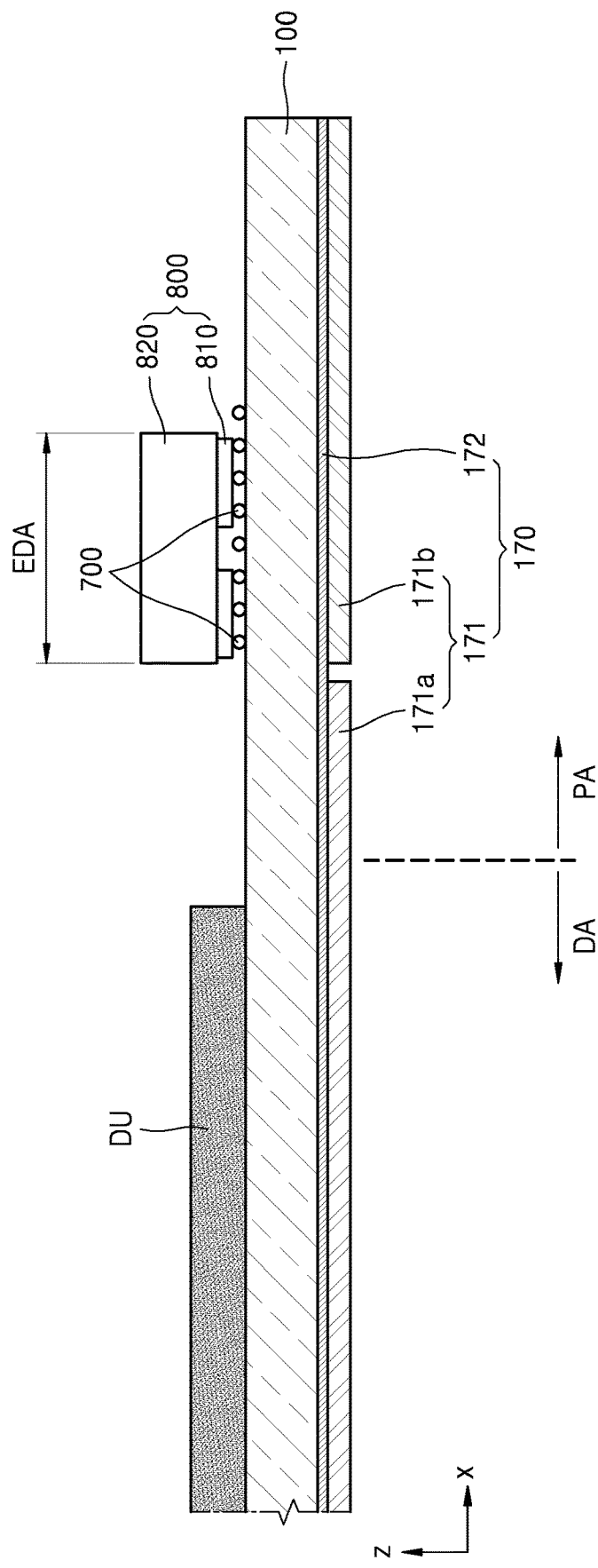
FIG. 9 is a schematic cross-sectional view of a part of a display apparatus according to an embodiment.

The second protective film base 171b having the higher light transmittance may correspond at least to the electronic device area EDA. As shown in FIG. 9, which is a schematic cross-sectional view of a part of a display apparatus according to an embodiment, the first end portion may be located in the peripheral area PA and the second end portion may correspond to an edge of the electronic device area EDA in the direction toward the display area DA (-x direction). In this case, the pressure mark test for checking a mounting status of the electronic device 800 may be sufficiently performed through the second protective film base 171b having the excellent light transmittance, and at the same time, the lower surface of the substrate 100 (in the -z direction) may be protected as much as possible by the first protective film base 171a having the excellent thermal resistance.

Figure 10:
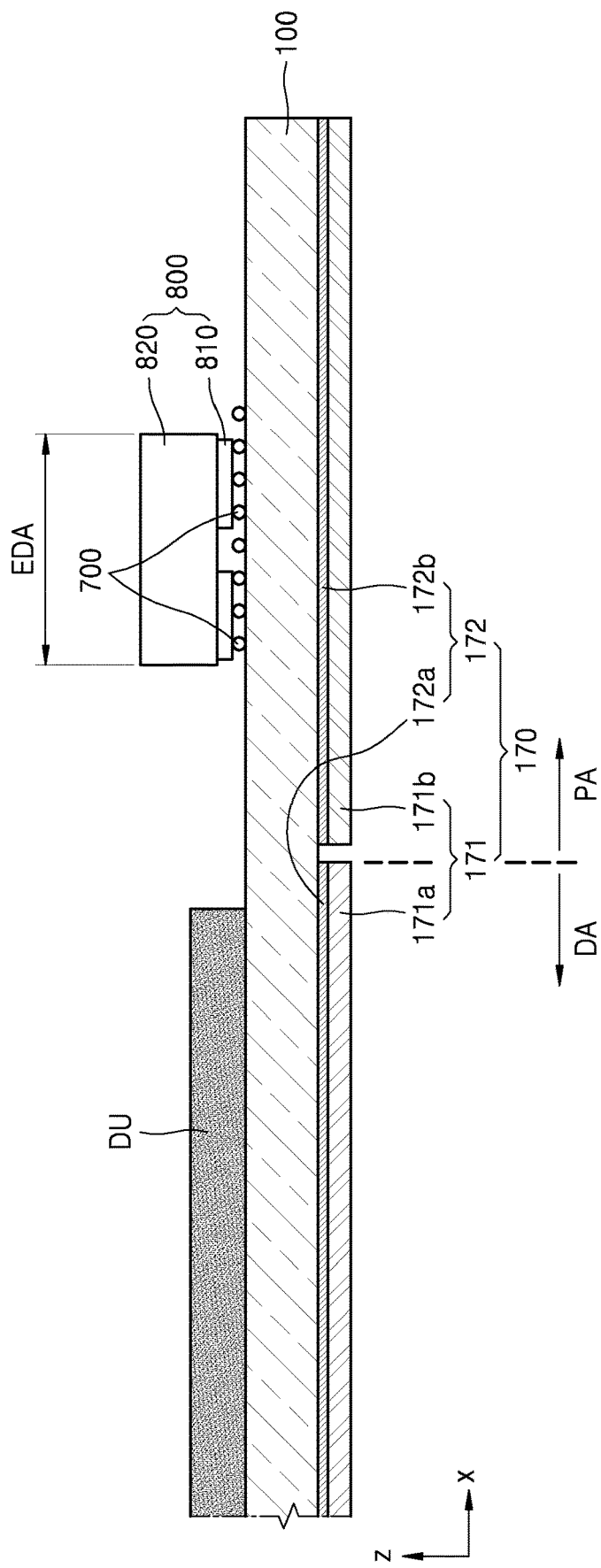
FIG. 10 is a schematic cross-sectional view of a part of a display apparatus according to an embodiment.

FIGS. 7 to 9 show that the first protective film base 171a and the second protective film base 171b of the protective film base 171 are spaced apart from each other on at least some parts thereof. As shown in FIG. 10, which is a schematic cross-sectional view of a part of a display apparatus according to an embodiment, the adhesive layer 172 may also include the first adhesive layer 172a and the second adhesive layer 172b, wherein the first adhesive layer 172a and the second adhesive layer 172b may be spaced apart from each other on at least some parts thereof.

That is, the first end portion of the first protective film base 171a in the direction toward the electronic device area EDA (+x direction) and the second end portion of the second protective film base 171b in the direction toward the display area DA (-x direction) may be spaced apart from each other, and an end portion of the first adhesive layer 172a corresponding to the first protective film base 171a in the direction toward the electronic device area EDA and an end portion of the second adhesive layer 172b corresponding to the second protective film base 171b in the direction toward the display area DA may be spaced apart from each other.

Figure 11:
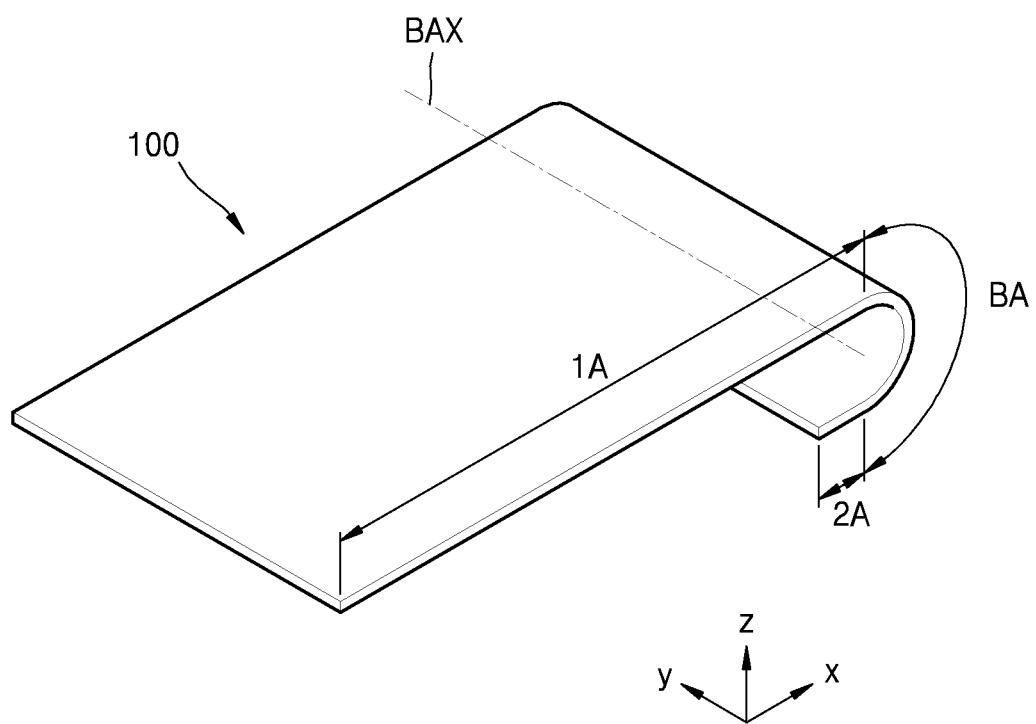
FIG. 11 is a schematic perspective view of a part of a display apparatus according to an embodiment.

The display apparatus having the substrate 100 of a flat state is described as above, but is not limited thereto. Referring to FIG. 11, which is a schematic perspective view of a part of a display apparatus according to an embodiment, a part of the display apparatus, that is, a part of the substrate 100, may be bent, so that the display apparatus may also have a partially bent shape like the substrate 100.

As shown in FIG. 11, the substrate 100 of the display apparatus according to the embodiment includes a bending area BA extending in a first direction (+y direction). The bending area BA is located between a first area 1A and a second area 2A in a second direction (+x direction) crossing the first direction. The first area 1A may include at least the display area DA as described above. The substrate 100 is bent about a bending axis BAX that extends in the first direction (+y direction) as shown in FIG. 1.

Figure 12:
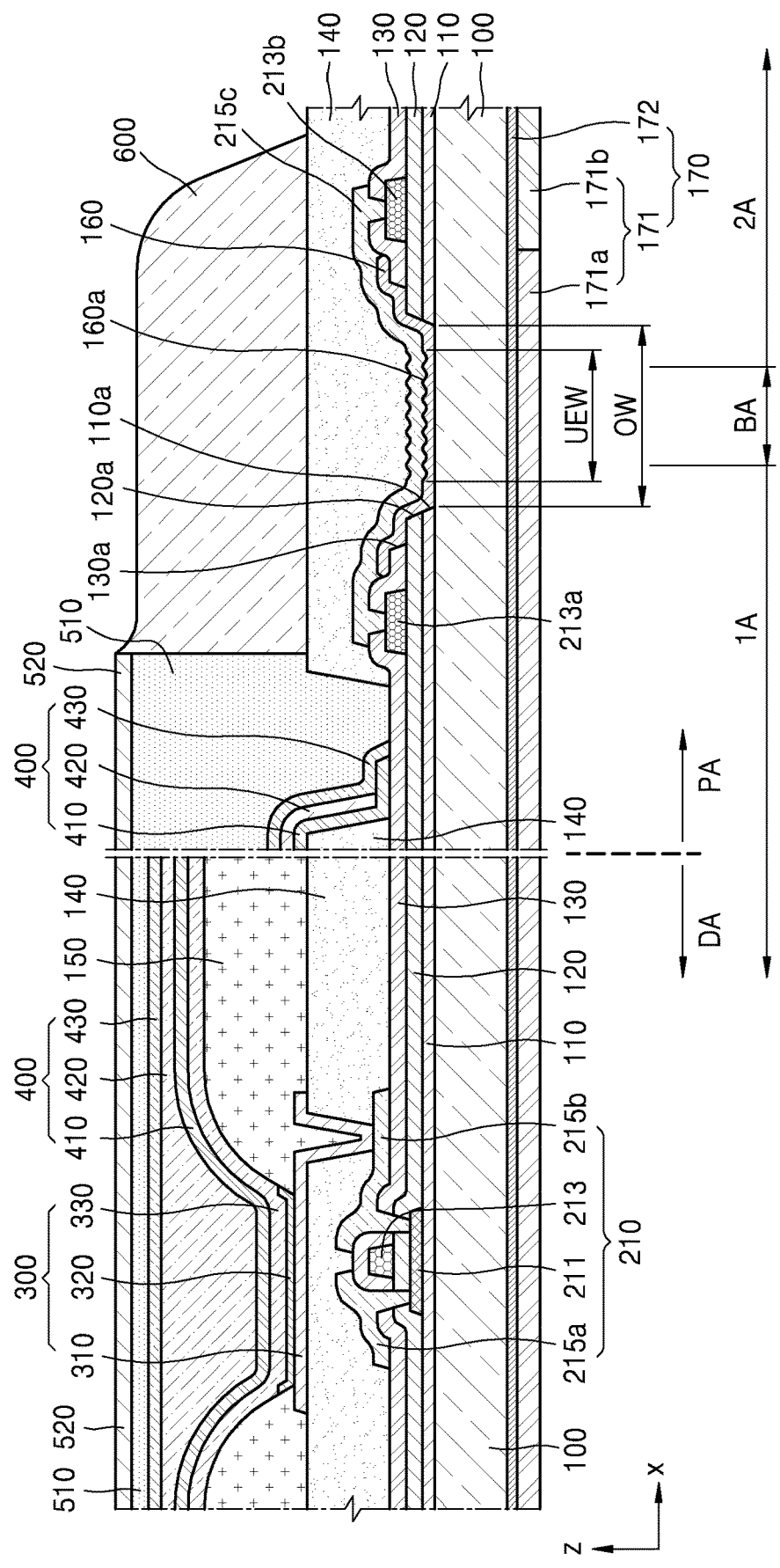
FIG. 12 is a schematic cross-sectional view of a modified example of the part of FIG. 11.

FIG. 12 is a schematic cross-sectional view of a modified part of the display apparatus of FIG. 11. As described above, the substrate 100 is bent at the bending area BA, but is shown not to be bent in FIG. 12 for convenience of description. This will be applied to embodiments that will be described later and modified examples thereof.

As shown in FIG. 12, the first area 1A of the substrate 100 includes the display area DA. The first area 1A may further include a part of the peripheral area PA outside the display area DA, in addition to the display area DA, as shown in FIG. 12. The second area 2A also includes the peripheral area PA. The display unit DU (see FIG. 1) including a display device, such as an organic light-emitting device 300, and a thin film transistor 210 may be located in the first area 1A. The display unit DU may only include components arranged in the display area DA, or may include components that are included in the first area 1A and arranged in the peripheral area PA. The substrate 100 has the bending area BA between the first area 1A and the second area 2A, and is bent at the bending area BA to have the shape shown in FIG. 11.

In the display area DA, the thin film transistor 210 to which the organic light-emitting device 300 is electrically connected may be in the display area DA, in addition to the display device such as the organic light-emitting device 300. Electric connection of the organic light-emitting device 300 to the thin film transistor 210 may be understood to be that a pixel electrode 310 is electrically connected to the thin film transistor 210. In some embodiments, a thin film transistor (not shown) may also be on a peripheral area outside the display area DA of the substrate 100. The thin film transistor on the peripheral area may be, for example, a part of a circuit unit for controlling electric signals that are applied to the display area DA.

The thin film transistor 210 may include a semiconductor layer 211 including amorphous silicon, polycrystalline silicon, or an organic semiconductor material, a gate electrode 213, a source electrode 215a, and a drain electrode 215b. To ensure insulation between the semiconductor layer 211 and the gate electrode 213, a gate insulating layer 120 may be between the semiconductor layer 211 and the gate electrode 213, wherein the gate insulating layer 120 includes an inorganic material such as silicon oxide, silicon nitride, and/or silicon oxynitride. In addition, an interlayer insulating layer 130 may be on the gate electrode 213, and a source electrode 215a and a drain electrode 215b may be on the interlayer insulating layer 130, wherein the interlayer insulating layer 130 includes an inorganic material such as silicon oxide, silicon nitride, and/or silicon oxynitride. The insulating layers including the inorganic material may be formed by chemical vapor deposition (CVD) or atomic layer deposition (ALD). This will be applied to other embodiments and modifications thereof that will be described later.

A buffer layer 110 may be between the thin film transistor 210 having the above structure and the substrate 100. The buffer layer 110 may include an inorganic material such as silicon oxide, silicon nitride, and/or silicon oxynitride. The buffer layer 110 may improve smoothness of the upper surface of the substrate 100, or prevent or reduce infiltration of impurities from the substrate 100 into the semiconductor layer 211 of the thin film transistor 210.

A planarization layer 140 may be arranged on the thin film transistor 210. For example, as shown in FIG. 12, when the organic light-emitting device 300 is arranged on the thin film transistor 210, the planarization layer 140 may planarize an upper portion of a protective layer covering the thin film transistor 210. The planarization layer 140 may include, for example, an organic material such as acryl, benzocyclobutene (BCB), and hexamethyldisiloxane (HMDSO). In FIG. 12, although the planarization layer 140 has a single-layered structure, the planarization layer 140 may be variously modified; for example, the planarization layer 140 may have a multi-layered structure. In addition, as shown in FIG. 12, the planarization layer 140 may have an opening outside the display area DA, such that a part of the planarization layer 140 in the display area DA and a part of the planarization layer 140 in the second area 2A may be physically separate from each other. Thus, impurities from outside may not reach the display area DA via the planarization layer 140.

In the display area DA, the organic light-emitting device 300 may be on the planarization layer 140. The organic light-emitting device 300 includes the pixel electrode 310, an opposite electrode 330, and an intermediate layer 320 between the pixel electrode 310 and the opposite electrode 330 and including an emission layer. The pixel electrode 310 may contact one of the source electrode 215a and the drain electrode 215b via an opening formed in the planarization layer 140 and be electrically connected to the thin film transistor 210, as shown in FIG. 12.

A pixel defining layer 150 may be on the planarization layer 140. The pixel defining layer 150 includes openings corresponding respectively to sub-pixels, that is, at least an opening exposing a center portion of the pixel electrode 310, to define pixels. Also, in the example shown in FIG. 12, the pixel defining layer 150 increases a distance between an edge of the pixel electrode 310 and the opposite electrode 330 above the pixel electrode 310 so as to prevent an arc from generating at the edge of the pixel electrode 310. The pixel defining layer 150 may include an organic material, for example, PI or HMDSO.

The intermediate layer 320 of the organic light-emitting device may include low-molecular weight organic materials or polymer materials. When the intermediate layer 320 includes a low-molecular weight organic material, the emission layer may include a hole injection layer (HIL), a hole transport layer (HTL), an emission layer (EML), an electron transport layer (ETL), and an electron injection layer (EIL) in a single or multiple-layered structure, and examples of organic materials may include copper phthalocyanine (CuPc), N,N'-Di(naphthalene-1-yl)-N,N'-diphenyl-benzidine (NPB), and tris-8-hydroxyquinoline aluminum ($Alq_3$). The low-molecular weight organic materials may be deposited by a vacuum deposition method.

When the intermediate layer 320 includes a polymer material, the intermediate layer 320 may include an HTL and an EML. Here, the HTL may include PEDOT, and the EML may include a poly-phenylenevinylene (PPV)-based or polyfluorene-based polymer material. The intermediate layer 320 above may be formed by a screen printing method, an inkjet printing method, or a laser induced thermal imaging (LITI) method.

However, the intermediate layer 320 is not limited to the above example, and may have various structures. In addition, the intermediate layer 320 may include a layer that is integrally formed throughout a plurality of pixel electrodes 310, or a layer that is patterned to correspond to each of the plurality of pixel electrodes 310.

The opposite electrode 330 is arranged above the display area DA, and as shown in FIG. 12, may cover the display area DA. That is, the opposite electrode 330 may be integrally formed with respect to a plurality of organic light-emitting devices, so as to correspond to a plurality of pixel electrodes 310.

Since the organic light-emitting device 300 may be easily damaged by external moisture or oxygen, an encapsulation layer 400 may cover the organic light-emitting device 300 to protect the organic light-emitting device. The encapsulation layer 400 covers the display area DA, and may also extend outside the display area DA. The encapsulation layer 400 may include a first inorganic encapsulation layer 410, an organic encapsulation layer 420, and a second inorganic encapsulation layer 430, as shown in FIG. 12.

The first inorganic encapsulation layer 410 covers the opposite electrode 330, and may include silicon oxide, silicon nitride, and/or silicon oxynitride. In some embodiments, other layers such as a capping layer may be arranged between the first inorganic encapsulation layer 410 and the opposite electrode 330. Since the first inorganic encapsulation layer 410 is formed according to a structure thereunder, the first inorganic encapsulation layer 410 may have an uneven upper surface as shown in FIG. 12. The organic encapsulation layer 420 covers the first inorganic encapsulation layer 410, and unlike the first inorganic encapsulation layer 410, the organic encapsulation layer 420 may have an even upper surface. In more detail, the organic encapsulation layer 420 may substantially have an even upper surface at a portion corresponding to the display area DA. The organic encapsulation layer 420 may include at least one material selected from the group consisting of PET, PEN, PC, PI, polyethylene sulfonate, polyoxymethylene, polyarylate, and hexamethyldisiloxane. The second inorganic encapsulation layer 430 covers the organic encapsulation layer 420, and may include silicon oxide, silicon nitride, and/or silicon oxynitride. The second inorganic encapsulation layer 430 may contact the first inorganic encapsulation layer 410 at an edge thereof outside the display area DA, such that the organic encapsulation layer 420 is not exposed to the outside.

As described above, since the encapsulation layer 400 includes the first inorganic encapsulation layer 410, the organic encapsulation layer 420, and the second inorganic encapsulation layer 430, even if there is a crack in the encapsulation layer 400 in the above multi-layered structure, the crack may be disconnected between the first inorganic encapsulation layer 410 and the organic encapsulation layer 420 or between the organic encapsulation layer 420 and the second inorganic encapsulation layer 430. As such, forming a path through which external moisture or oxygen may infiltrate into the display area DA may be prevented or reduced.

In some embodiments, a touch electrode of various patterns for implementing a touch screen function or a touch protective layer for protecting the touch electrode layer may be arranged on the encapsulation layer 400. In addition, a polarization plate 520 may be attached on the encapsulation layer 400 via an optically clear adhesive (OCA) 510. If there is the touch electrode or the touch protective layer on the encapsulation layer 400, the OCA 510 and the polarization plate 520 are above the touch electrode or the touch protective layer. In addition, a printed circuit board (not shown) or an electronic chip (not shown) may be attached to the second area 2A. In FIG. 12, a part of the substrate 100 opposite to the display area DA (that is, +x direction) is omitted. In addition, a bending protection layer (BPL) 600 may be on outside the display area DA.

The polarization layer 520 may reduce reflection of external light. For example, when an external light passing through the polarization plate 520 is reflected by an upper surface of the opposite electrode 330 and then passes through the polarization plate 520 again, the external light passes through the polarization plate 520 twice, and a phase of the external light may be changed. Therefore, because a phase of reflected light is different from the phase of the external light entering the polarization plate 520, destructive interference occurs, and accordingly, the reflection of the external light may be reduced, and visibility may be improved. The OCA 510 and the polarization plate 520 may cover an opening in the planarization layer 140, as shown in FIG. 2. The display apparatus according to one or more embodiments may not essentially include the polarization plate 520, and in some embodiments, the polarization plate 520 may be omitted or replaced by other elements. For example, the polarization plate 520 may be omitted, and a black matrix and a color filter may be used to reduce reflection of external light.

In addition, the buffer layer 110, the gate insulating layer 120, and the interlayer insulating layer 130 including the inorganic material may be collectively referred to as an inorganic insulating layer. The inorganic insulating layer may include an opening corresponding to the bending area BA, as shown in FIG. 12. That is, the buffer layer 110, the gate insulating layer 120, and the interlayer insulating layer 130 may respectively include openings 110a, 120a, and 130a corresponding to the bending area BA. That the opening corresponds to the bending area BA may denote that the opening overlaps with the bending area BA. Here, an area of the opening may be greater than that of the bending area BA. To do this, in FIG. 12, a width OW of the opening is greater than that of the bending area BA. Here, the area of the opening may be defined as the smallest area among areas of the openings 110a, 120a, and 130a of the buffer layer 110, the gate insulating layer 120, and the interlayer insulating layer 130. In addition, in FIG. 12, the area of the opening is defined by an area of the opening 110a in the buffer layer 110.

In FIG. 12, although an inner side surface of the opening 110a of the buffer layer 110 and an inner side surface of the opening 120a in the gate insulating layer 120 correspond to each other, one or more embodiments are not limited thereto. For example, an area of the opening 120a of the gate insulating layer 120 may be greater than that of the opening 110a in the buffer layer 110. In this case, the area of the opening may be also defined as the smallest area among areas of the openings 110a, 120a, and 130a of the buffer layer 110, the gate insulating layer 120, and the interlayer insulating layer 130.

The display apparatus according to the embodiment of FIG. 12 includes an organic material layer 160 that fills at least partially the opening in the inorganic insulating layer. In FIG. 12, the organic material layer 160 completely fills the opening. In addition, the display apparatus according to the embodiment includes a first conductive layer 215c that extends from the first area 1A to the second area 2A through the bending area BA and is above the organic material layer 160. The first conductive layer 215c may be on the inorganic insulating layer such as the interlayer insulating layer 130 if the organic material layer 160 is omitted. The first conductive layer 215c may be formed simultaneously with the source electrode 215a or the drain electrode 215b by using the same material as that of the source electrode 215a or the drain electrode 215b.

As described above, although FIG. 12 shows a state in which the display apparatus is not bent for convenience of description, the display apparatus according to the embodiment is actually in a state in which the substrate 100 is bent at the bending area BA, as shown in FIG. 11. To do this, the display apparatus is manufactured so that the substrate 100 is flat, as shown in FIG. 12, during the manufacturing processes, and after that, the substrate 100 is bent at the bending area BA so that the display apparatus may have the shape as shown in FIG. 11. Here, while the substrate 100 is bent at the bending area BA, tensile stress may be applied to the first conductive layer 215c. However, in the display apparatus according to the embodiment, the occurrence of defects in the first conductive layer 215c during the bending process may be prevented or reduced.

If the inorganic insulating layer including the buffer layer 110, the gate insulating layer 120, and/or the interlayer insulating layer 130 does not include the opening corresponding to the bending area BA, but continuously extends from the first area 1A to the second area 2A, and if the first conductive layer 215c is on such above inorganic insulating layer, large tensile stress is applied to the first conductive layer 215c during bending the substrate 100. In particular, since the inorganic insulating layer has a greater hardness than that of an organic material layer, cracks are likely to form in the inorganic insulating layer in the bending area BA. When a crack occurs in the inorganic insulating layer, the crack may also occur in the first conductive layer 215c on the inorganic insulating layer, and thus, the probability of generating defects such as disconnection in the first conductive layer 215c increases greatly.

However, according to the display apparatus of the embodiment, the inorganic insulating layer includes the opening corresponding to the bending area BA, and the part of the first conductive layer 215c, which corresponds to the bending area BA, is on the organic material layer 160 that at least partially fills the opening of the inorganic insulating layer. Since the inorganic insulating layer includes the opening corresponding to the bending area BA, the possibility of cracks occurring in the inorganic insulating layer is greatly low, and the organic material layer 160 is less likely to have cracks due to characteristics of the organic material. Therefore, the occurrence of cracks on the organic material layer 160 in the portion of the first conductive layer 215c corresponding to the bending area BA may be prevented or reduced. Since the organic material layer 160 has a lower hardness than that of an inorganic material layer, the organic material layer 160 may absorb the tensile stress generated due to the bending of the substrate 100 and thereby reduce concentration of the tensile stress on the first conductive layer 215c.

The display apparatus according to the embodiment may include second conductive layers 213a and 213b, in addition to the first conductive layer 215c. The second conductive layers 213a and 213b are formed in the first area 1A or the second area 2A at a layer level different from that of the first conductive layer 215c, and may be electrically connected to the first conductive layer 215c. In FIG. 12, the second conductive layers 213a and 213b may include the same material as that of the gate electrode 213 of the thin film transistor 210, and be at the same layer as the gate electrode 213, that is, on the gate insulating layer 120. In addition, the first conductive layer 215c contacts the second conductive layers 213a and 213b via contact holes formed in the interlayer insulating layer 130. In addition, the second conductive layer 213a is in the first area 1A, and the second conductive layer 213b is in the second area 2A.

The second conductive layer 213a in the first area 1A may be electrically connected to the thin film transistor 210 within the display area DA, and accordingly, the first conductive layer 213c may be electrically connected to the thin film transistor 210 of the display area DA via the second conductive layer 213a. The second conductive layer 213b in the second area 2A may also be electrically connected to the thin film transistor 210 of the display area DA via the first conductive layer 215c. As such, the second conductive layers 213a and 213b that are outside the display area DA may be electrically connected to the elements in the display area DA, or may extend toward the display area DA so that at least some parts of the second conductive layers 213a and 213b may be located in the display area DA.

As described above, although FIG. 12 shows a state in which the display apparatus is not bent for convenience of description, the display apparatus according to the embodiment is actually in a state in which the substrate 100 is bent at the bending area BA, as shown in FIG. 11. To do this, the display apparatus is manufactured so that the substrate 100 is flat, as shown in FIG. 12, during the manufacturing processes, and after that, the substrate 100 is bent at the bending area BA so that the display apparatus may have the shape as shown in FIG. 11. Here, while the substrate 100 is bent at the bending area BA, tensile stress may be applied to the elements in the bending area BA.

Therefore, the first conductive layer 215c crossing over the bending area BA includes a material having high elongation rate, so that defects such as cracks in the first conductive layer 215c or disconnection of the first conductive layer 215c may be prevented. In addition, the second conductive layers 213a and 213b including a material having an elongation rate lower than that of the first conductive layer 215c, and electrical/physical characteristics different from those of the first conductive layer 215c are formed in the first area 1A or the second area 2A, and thus, an efficiency of transferring electric signals in the display apparatus may be improved, or a defect rate during the manufacturing processes of the display apparatus may be reduced. For example, the second conductive layers 213a and 213b may include molybdenum, and the first conductive layer 215c may include aluminum. The first conductive layer 215c and the second conductive layers 213a and 213b may have multi-layered structures, according to some embodiments.

Unlike the example of FIG. 12, at least a part of an upper portion of the second conductive layer 213b in the second area 2A may not be covered by the planarization layer 140, but is exposed to the outside, in order to electrically connect to various electronic devices or printed circuit boards.

In addition, as shown in FIG. 12, the organic material layer 160 may have an uneven surface 160a in at least a part of an upper surface thereof in a +z direction. Since the organic material layer 160 includes the uneven surface 160a, the first conductive layer 215c on the organic material layer 160 may have an upper surface and/or a lower surface having a shape corresponding to the uneven surface 160a of the organic material layer 160.

As described above, since the tensile stress may be applied to the first conductive layer 215c when the substrate 100 is bent at the bending area BA in the manufacturing processes, when the upper surface and/or the lower surface of the first conductive layer 215c has a shape corresponding to the uneven surface 160a of the organic material layer 160, the amount of tensile stress applied to the first conductive layer 215c may be reduced. That is, the tensile stress generated during the bending process may be reduced via deformation of the shape of the organic material layer 160 having a relatively smaller hardness. Here, the first conductive layer 215c having the uneven shape at least before the bending process may be transformed to correspond to the shape of the organic material layer 160, which is deformed due to the bending process, and thus, the occurrence of defects such as disconnection in the first conductive layer 215c may be prevented.

Also, since the uneven surface 160a is formed at least partially in the upper surface of the organic material layer 160 (in the +z direction), a surface area of the upper surface of the organic material layer 160 and a surface area of the upper and lower surfaces of the first conductive layer 215c in the opening may be increased. A large surface area of the upper surface of the organic material layer 160 and the upper and lower surfaces of the first conductive layer 215c may denote that a deformation margin is large in order to reduce the tensile stress caused due to the bending of the substrate 100.

Since the first conductive layer 215c is on the organic material layer 160, the lower surface of the first conductive layer 215c has a shape corresponding to the uneven surface 160a of the organic material layer 160. However, the upper surface of the first conductive layer 215c may have an uneven surface that has an independent shape from the shape of the uneven surface 160a of the organic material layer 160.

The uneven surface 160a in the upper surface (in the +z direction) of the organic material layer 160 may be formed in various ways. For example, a photoresist material may be used when the organic material layer 160 is formed, and an exposure amount may vary depending on locations in the organic material layer 160, the upper surface of which is flat, by using a slit mask or a half-tone mask so that a certain part may be etched (removed) more than other parts. Here, the part that is etched more may be a depressed portion in the upper surface of the organic material layer 160. The method used when manufacturing the display apparatus according to the embodiment is not limited to the above example. For example, after forming the organic material layer 160 having a flat upper surface, certain portions may be removed by a dry etching method, and other various methods may be used.

The organic material layer 160 may have the uneven surface 160a in the upper surface (in the +z direction) thereof. For example, the organic material layer 160 may include a plurality of grooves in the upper surface (in the +z direction) thereof, wherein the plurality of grooves extend in the first direction (+y direction). Here, the shape of the upper surface of the first conductive layer 215c on the organic material layer 160 corresponds to the shape of the upper surface of the organic material layer 160.

The uneven surface 160a of the organic material layer 160 may only be within the opening of the inorganic insulating layer. In FIG. 12, a width UEW of the uneven surface 160a of the organic material layer 160 is less than a width OW of the opening of the inorganic insulating layer. If the organic material layer 160 has the uneven surface 160a throughout the inside and outside the opening in the inorganic insulating layer, the uneven surface 160a of the organic material layer 160 is near the internal surface of the opening 110a in the buffer layer 110, the internal surface of the opening 120a in the gate insulating layer 120, or the internal surface of the opening 130a in the interlayer insulating layer 130. In this case, the organic material layer 160 has a relatively smaller thickness on depressed portions than that on protruding portions, and thus, when the depressed portions are located around the internal surface of the opening 110a in the buffer layer 110, the internal surface of the opening 120a in the gate insulating layer 120, or the internal surface of the opening 130a in the interlayer insulating layer 130, the organic material layer 160 may be disconnected. Therefore, the uneven surface 160a of the organic material layer 160 may only be within the opening of the inorganic insulating layer, and thus, the disconnection of the organic material layer 160 around the internal surface of the opening 110a in the buffer layer 110, the internal surface of the opening 120a of the gate insulating layer 120, or the internal surface of the opening 130a in the interlayer insulating layer 130 may be prevented.

As described above, so as not to generate the disconnection in the first conductive layer 215c at the bending area BA, the organic material layer 160 may have the uneven surface 160a over the bending area BA. Therefore, an area of the uneven surface 160a of the organic material layer 160 may be greater than that of the bending area BA and smaller than that of the opening. That is, as shown in FIG. 12, the width UEW of the uneven surface 160a of the organic material layer 160 is greater than the width of the bending area BA and less than the width OW of the opening.

If one of the buffer layer 110, the gate insulating layer 120, and the interlayer insulating layer 130 includes an organic insulating material, the organic material layer 160 may be formed simultaneously with forming of such a layer including the organic insulating material, and moreover, the layer including the organic insulating material may be integrally formed with the organic material layer 160. The organic insulating material may include PET, PEN, PC, PI, polyethylene sulfonate, polyoxymethylene, polyarylate, and hexamethyldisiloxane.

In addition, the BPL 600 may be located outside the display area DA. That is, the BPL 600 may be located over the first conductive layer 215c, corresponding at least to the bending area BA.

When a stack structure is bent, there is a stress neutral plane in the stack structure. If there is no BPL 600, when the substrate 100 is bent, excessive tensile stress may be applied to the first conductive layer 215c in the bending area BA, because the location of the first conductive layer 215c may not correspond to a stress neutral plane. However, by forming the BPL 600 and adjusting a thickness and a modulus of the BPL 600, a location of the stress neutral plane in the stack structure including the substrate 100, the first conductive layer 215c, and the BPL 600 may be adjusted. Therefore, the stress neutral plane may be adjusted to be around the first conductive layer 215c via the BPL 600, and thus, the tensile stress applied to the first conductive layer 215c may be reduced.

The BPL 600 may extend to an end of the substrate 100 in the display apparatus, unlike the example of FIG. 12. For example, in the second area 2A, the first conductive layer 215c, the second conductive layer 213b, and/or other conductive layers electrically connected to the first and second conductive layers 215c and 213b may not be covered at least partially by the interlayer insulating layer 130 or the planarization layer 140, but may be electrically connected to various electronic devices or printed circuit boards. Accordingly, the first conductive layer 215c, the second conductive layer 213b, and/or the other conductive layers electrically connected to the first and second conductive layers 215c and 213b may have portions that are electrically connected to the various electronic devices or the printed circuit boards. Here, the electrically connected portions need to be protected against external impurities such as external moisture, and thus, the BPL 600 may cover the electrically connected portions so as to perform as a protective layer as well. To do this, the BPL 600 may extend to, for example, the end of the substrate 100 of the display apparatus.

In addition, in FIG. 12, although the upper surface of the BPL 600 in a direction toward the display area DA (−x direction) coincides with the upper surface of the polarization plate 520 in the +z direction, one or more embodiments are not limited thereto. For example, the end of the BPL 600 in the display area DA direction (−x direction) may partially cover the upper surface at the end of the polarization plate 520. In another example, the end of the BPL 600 in the display area DA direction (−x direction) may not contact the polarization plate 520 and/or the OCA 510. In the latter case, during or after forming the BPL 600, moving of gas generated from the BPL 600 in a direction toward the display area DA (−x direction) and degrading the display device 300 such as the organic light-emitting device 300 may be prevented.

As shown in FIG. 2, if the upper surface of the BPL 600 in a direction toward the display area DA (−x direction) coincides with the upper surface of the polarization plate 520 in the +z direction, if the end of the BPL 600 in the display area DA direction (−x direction) partially covers the upper surface at the end of the polarization plate 520, or if the end of the BPL 600 in the display area DA direction (−x direction) contacts the OCA 510, a thickness of the BPL 600 corresponding to the display area DA (−x direction) may be greater than that of the other portions in the BPL 600. Since a liquid phase material or a paste-type material may be applied and hardened to form the BPL 600, a volume of the BPL 600 may be reduced through the hardening process. Here, if the portion of the BPL 600 corresponding to the display area DA (−x direction) is in contact with the polarization plate 520 and/or the OCA 510, the portion of the BPL 600 is fixed at the location, and thus, a volume reduction occurs in remaining portion of the BPL 600. Therefore, the thickness of the BPL 600 corresponding to the display area DA (−x direction) may be greater than that of the other portion in the BPL 600.

In the above description, the buffer layer 110, the gate insulating layer 120, and the interlayer insulating layer 130 are described to have the openings 110a, 120a, and 130a respectively corresponding to the bending area BA, but one or more embodiments are not limited thereto. For example, the buffer layer 110 may be integrally formed throughout the first area 1A, the bending area BA, and the second area 2A without an opening, and the gate insulating layer 120 and the interlayer insulating layer 130 may only have the openings 120a and 130a. In this case, the inorganic insulating layer including the buffer layer 110, the gate insulating layer 120, and the interlayer insulating layer 130 may have a groove, not an opening, and the organic material layer 160 may be understood to fill the groove of the inorganic insulating layer. That is, the opening in the inorganic insulating layer described above may be replaced with the groove.

The display apparatus according to the embodiment includes the protective film 170 as well. The protective film 170 includes the protective film base 171 and the adhesive layer 172, and detailed structures thereof are described above with reference to FIGS. 1 to 9.

The configurations described above with reference to FIGS. 11 and 12 may be mostly applied to the other embodiments that will be described later and modified examples thereof.

If the substrate 100 is bent at the bending area BA, the protective film 170 is also bent at the bending area BA. Here, the protective film 170 may not be completely bent due to the mechanical strength thereof, or stress caused by the protective film 170 may be applied to the substrate and defects such as a crack may occur in the substrate 100. Therefore, to prevent the above defects, a part of the protective film base 171 corresponding to the bending area BA may include a plurality of openings or a plurality of grooves. When the protective film base 171 includes the plurality of openings or the plurality of grooves, bending of the protective film base 171 at the bending area BA may be sufficiently performed. Hereinafter, a case in which the protective film base 171 includes the plurality of openings will be described below for convenience of description, but one or more embodiments are not limited thereto. For example, the protective film base 171 may include the plurality of grooves, instead of the plurality of openings.

Figure 13:
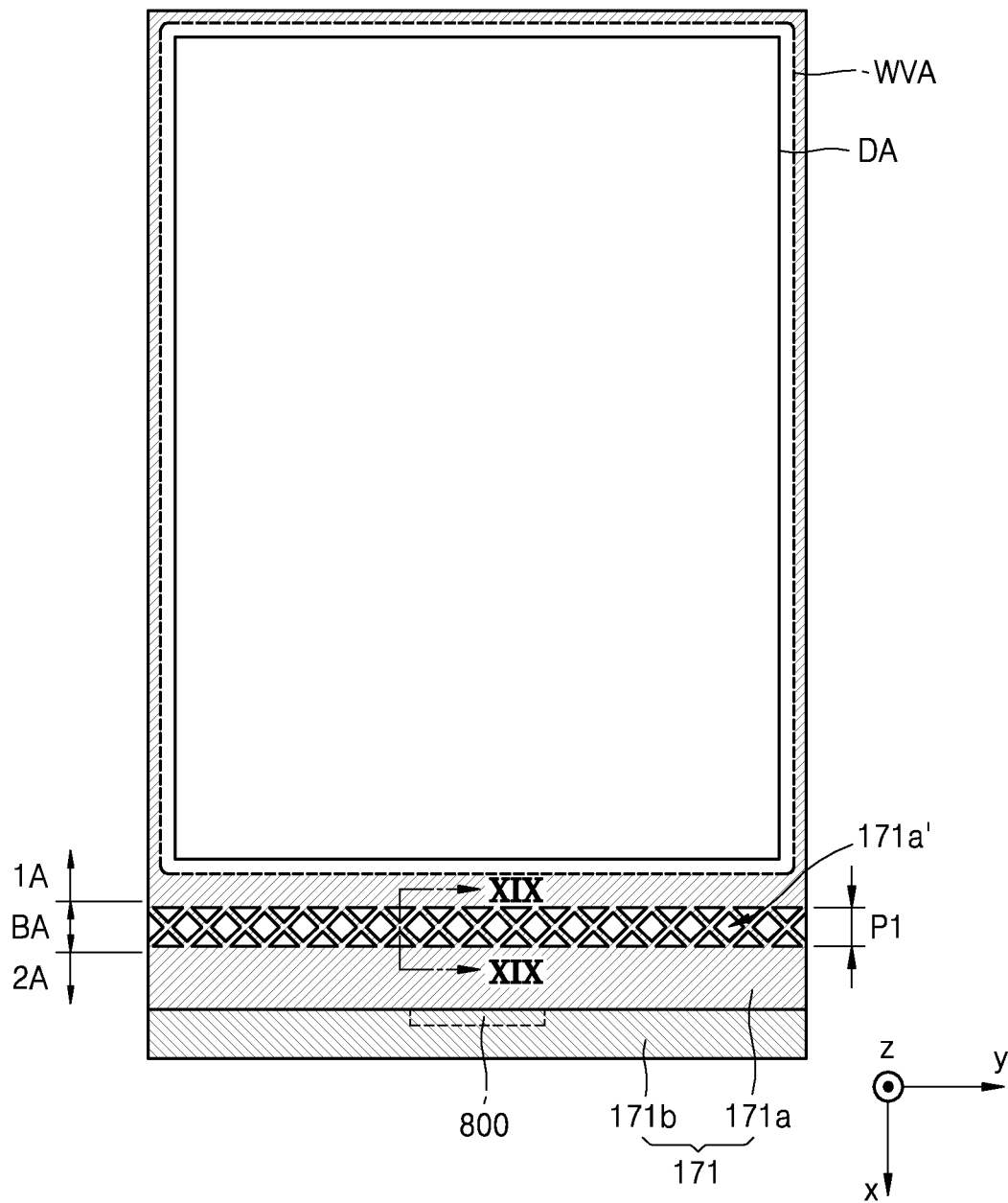
FIG. 13 is a schematic plan view of a part of a protective film included in a display apparatus according to an embodiment.

In detail, as shown in FIG. 13, which is a schematic plan view of a part of the protective film 170, that is, the protective film base 171, in a display apparatus according to an embodiment, the first protective film base 171a may correspond to the bending area BA. That is, the first protective film base 171a may correspond to the bending area BA and a part of the second area 2A, as well as the display area DA. In this case, as shown in FIG. 13, the first protective film base 171a may not correspond to the portion corresponding to the electronic device 800, and instead, the second protective film base 171b corresponds to the electronic device 800. FIG. 13 also shows a window view area WVA, which is an area including the display area DA and understood as a light transmitting area of a window disposed above the display unit DU for protecting the display unit DU.

Here, a part of the first protective film base 171a corresponding to the bending area BA may include a plurality of openings 171a'. The display apparatus according to the embodiment has the substrate 100 and the protective film base 171 that are bent at the bending area BA, but FIG. 13 shows the protective film base 171 in a flat state for convenience of description, and this will be applied to other embodiments that will be described later and modified examples thereof.

Figure 14:
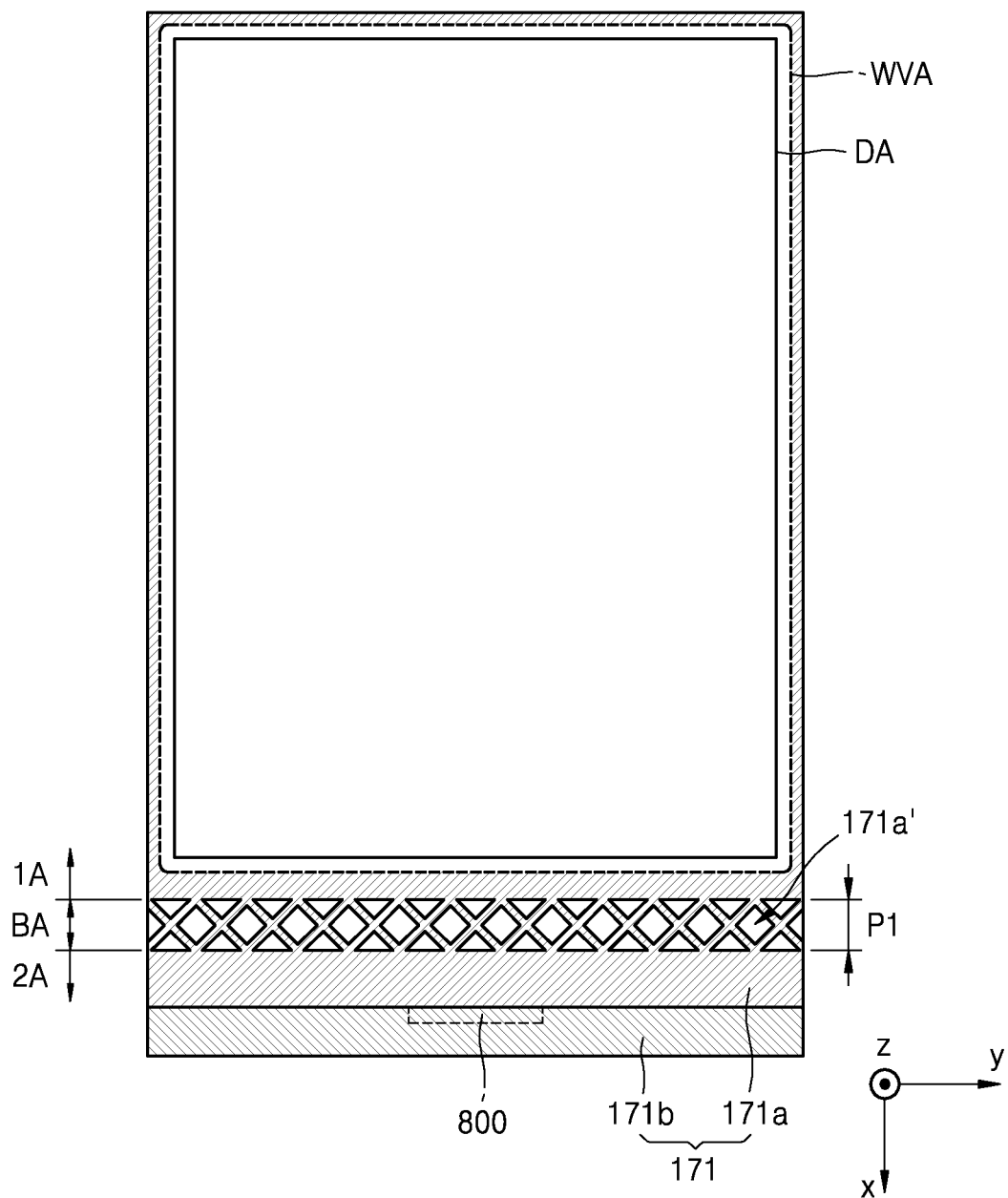
FIG. 14 is a schematic plan view of a part of a protective film included in a display apparatus according to an embodiment.

A portion P1 in the first protective film base 171a, in which the plurality of openings 171a' are formed, may have an area that is less than that of the bending area BA, as shown in FIG. 13, in a case in which protecting of the substrate 100 is more important than bending of the substrate 100. However, in a case in which the bending of the substrate 100 is prior to protecting of the substrate 100, as shown in FIG. 14, which is a schematic plan view of a part of a protective film in a display apparatus according to an embodiment, the portion P1 of the first protective film base 171a, in which the plurality of openings 171a' are formed, may have an area that is equal to that of the bending area BA. Moreover, as shown in FIG. 15, which is a schematic plan view of a part of a protective film in a display apparatus according to an embodiment, the portion P1 of the first protective film base 171a, in which the plurality of openings 171a' are formed, may have an area that is greater than that of the bending area BA.

Figure 15:
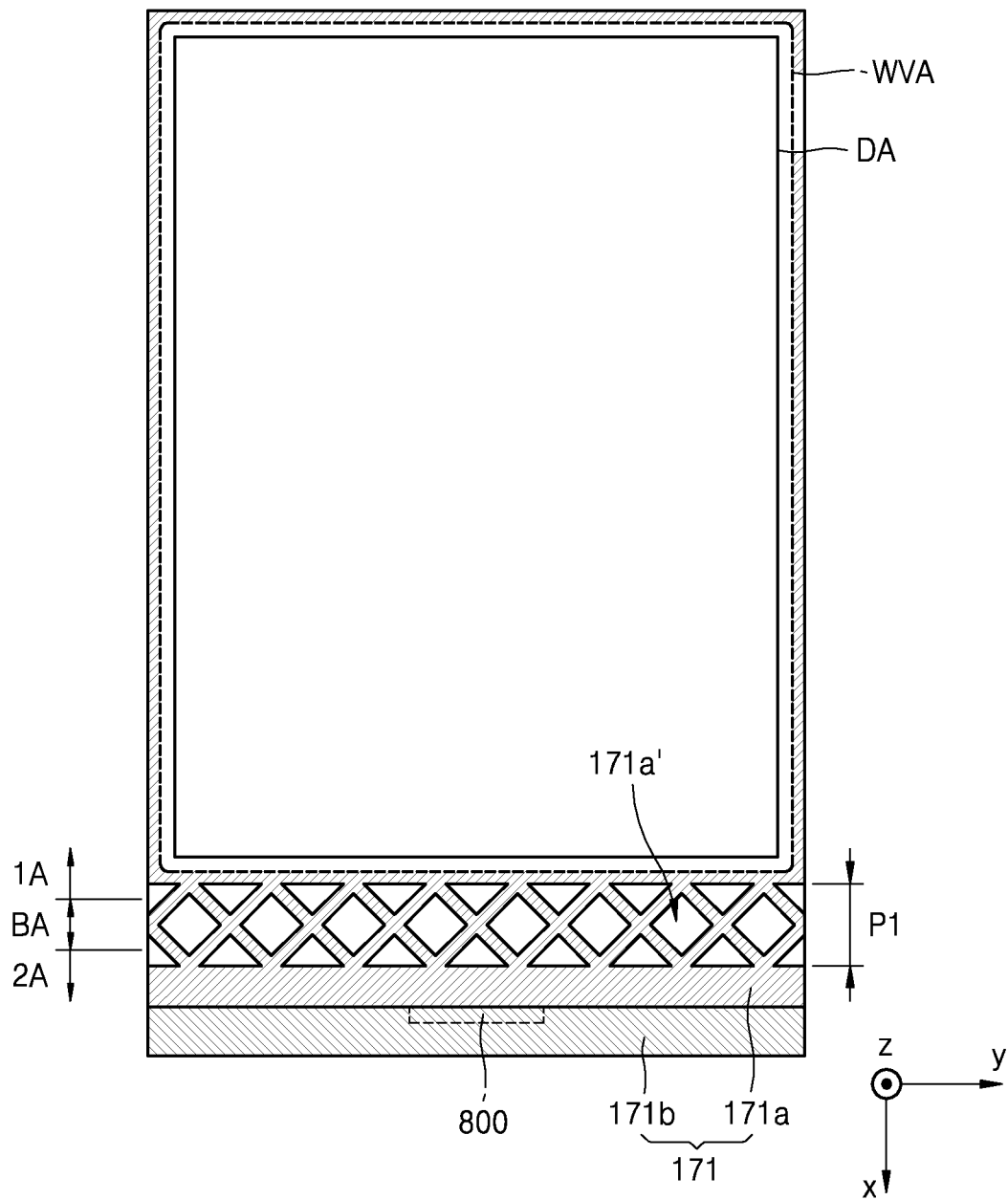
FIG. 15 is a schematic plan view of a part of a protective film included in a display apparatus according to an embodiment.

In addition, as shown in FIGS. 13 to 15, the openings 171a' of the first protective film base 171a do not extend in a direction in which the bending axis extends (y-axis direction), that is, a direction perpendicular to an axis (x-axis direction) connecting the first area 1A to the second area 2A. When taking into account a cross-section on a plane (yz plane) including the y-axis and being perpendicular to the x-axis within the bending area BA, the first protective film base 171a has a discontinuous shape.

If the openings 171a' of the first protective film base 171a extend in the direction (y-axis direction), in which the bending axis extends, the bending of the first protective film base 171a may be sufficiently performed, but the stress applied to the substrate 100 by the first protective film base 171a may not be uniform within the bending area BA. This may cause defects such as a crack in the substrate 100. In addition, if the BPL 600 does not have a uniform thickness, the crack may occur in the first conductive layer 215c within the bending area BA due to the stress generated by the BPL 600. However, when the openings 171a' of the first protective film base 171a do not extend in the direction (y-axis direction) in which the bending axis extends, the first protective film base 171a may sufficiently support the substrate 100 while being bent easily at the bending area BA, and accordingly, influence of the stress caused by the BPL 600 having uneven thickness to the first conductive layer 215c or the substrate 100 may be reduced.

Figure 16:
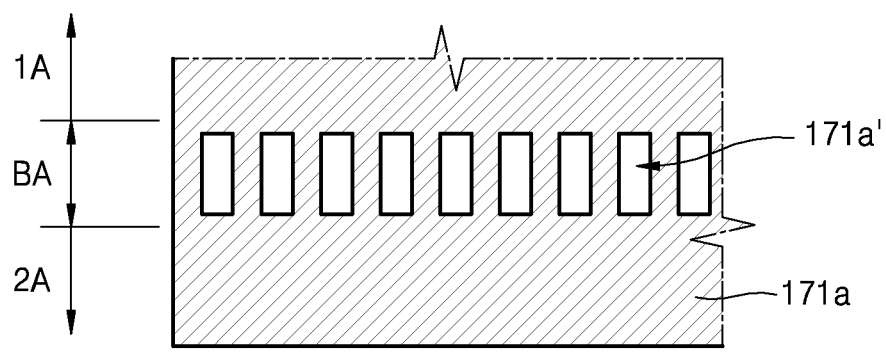
FIG. 16 is a schematic plan view of a part of a protective film included in a display apparatus according to an embodiment.
Figure 16:
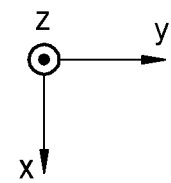

Each of the openings 171a' of the first protective film base 171a may extend from the display area DA toward the peripheral area PA in a virtual curved surface that is in parallel with the upper surface of the bent substrate 100, as shown in FIG. 16, which is a schematic plan view of a part of the first protective film base 171a in a display apparatus according to an embodiment. Since FIG. 16 shows that the first protective film base 171a is in a flat state for convenience of description, each opening 171a' is shown to extend in the x-axis direction.

Figure 17:
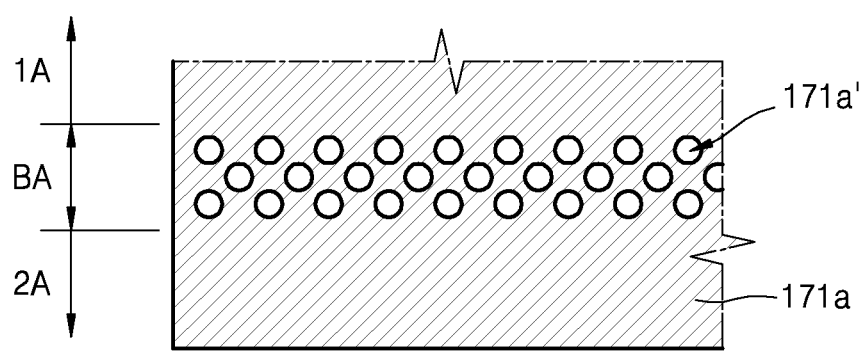
FIG. 17 is a schematic plan view of a part of a protective film included in a display apparatus according to an embodiment.
Figure 17:
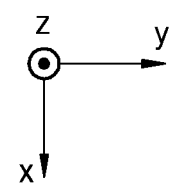
Figure 18:
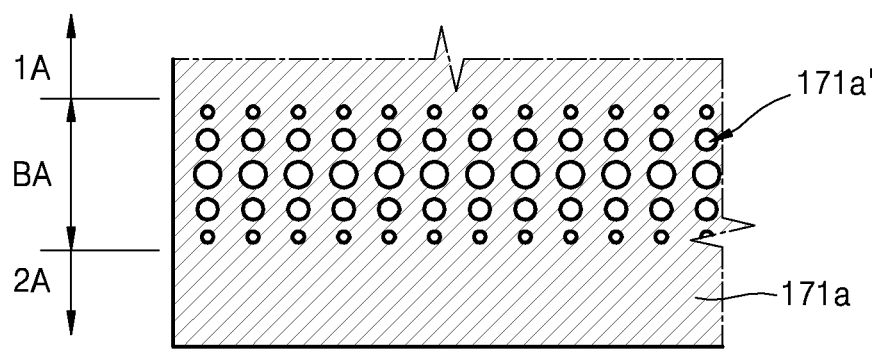
FIG. 18 is a schematic plan view of a part of a protective film included in a display apparatus according to an embodiment.
Figure 18:
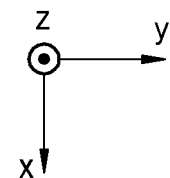

As shown in FIG. 17, which is a schematic plan view of a part of the first protective film base 171a in a display apparatus according to an embodiment, each of the plurality of openings 171a' may have a circular shape or a shape similar to the circle, and the plurality of openings 171a' may be arranged in zig-zags. In addition, as shown in FIG. 18, which is a schematic plan view of a part of the first protective film base 171a in a display apparatus according to an embodiment, from among the plurality of openings 171a' of the first protective film base 171a, the openings 171a' located at a center portion of the bending area BA may each have an area that is greater than that of each of the openings 171a' located near edges of the bending area BA. In the latter case, the first protective film base 171a may be easily bent at the center portion of the bending area BA, and in other portions in the bending area BA, the first protective film base 171a' may be easily bent while sufficiently supporting the substrate 100.

Figure 19:
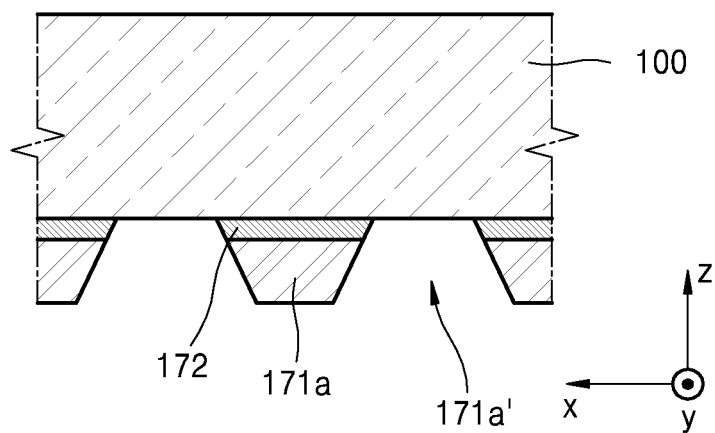
FIG. 19 is a schematic cross-sectional view of the display apparatus taken along a line XIX-XIX of FIG. 13.

In addition, as shown in FIG. 19, which is a schematic cross-sectional view of the display apparatus taken along a line XIX-XIX of FIG. 13, inner side surfaces of the plurality of openings 171a' may not be perpendicular to the upper surface of the substrate 100 (in the +z direction).

As described above, although the display apparatus is not shown to be in the bent state in FIGS. 12 and 13, the display apparatus according to the embodiment is bent at the bending area BA as shown in FIG. 11. Since the protective film base 171 is also bent at the bending area BA, there may be stress therein even if the plurality of openings 171a' are provided. The stress may cause isolation of the protective film 170 from the substrate 100. However, according to the display apparatus of the embodiment, since the inner side surfaces of the plurality of openings 171a' are not perpendicular to the upper surface of the substrate 100 (in the +z direction), an amount of the internal stress may be greatly reduced. That is, the thickness of the first protective film base 171a is reduced near the openings 171a' of the first protective film base 171a, and thus, the amount of the internal stress in the first protective film base 171a may be greatly reduced.

Figure 20:
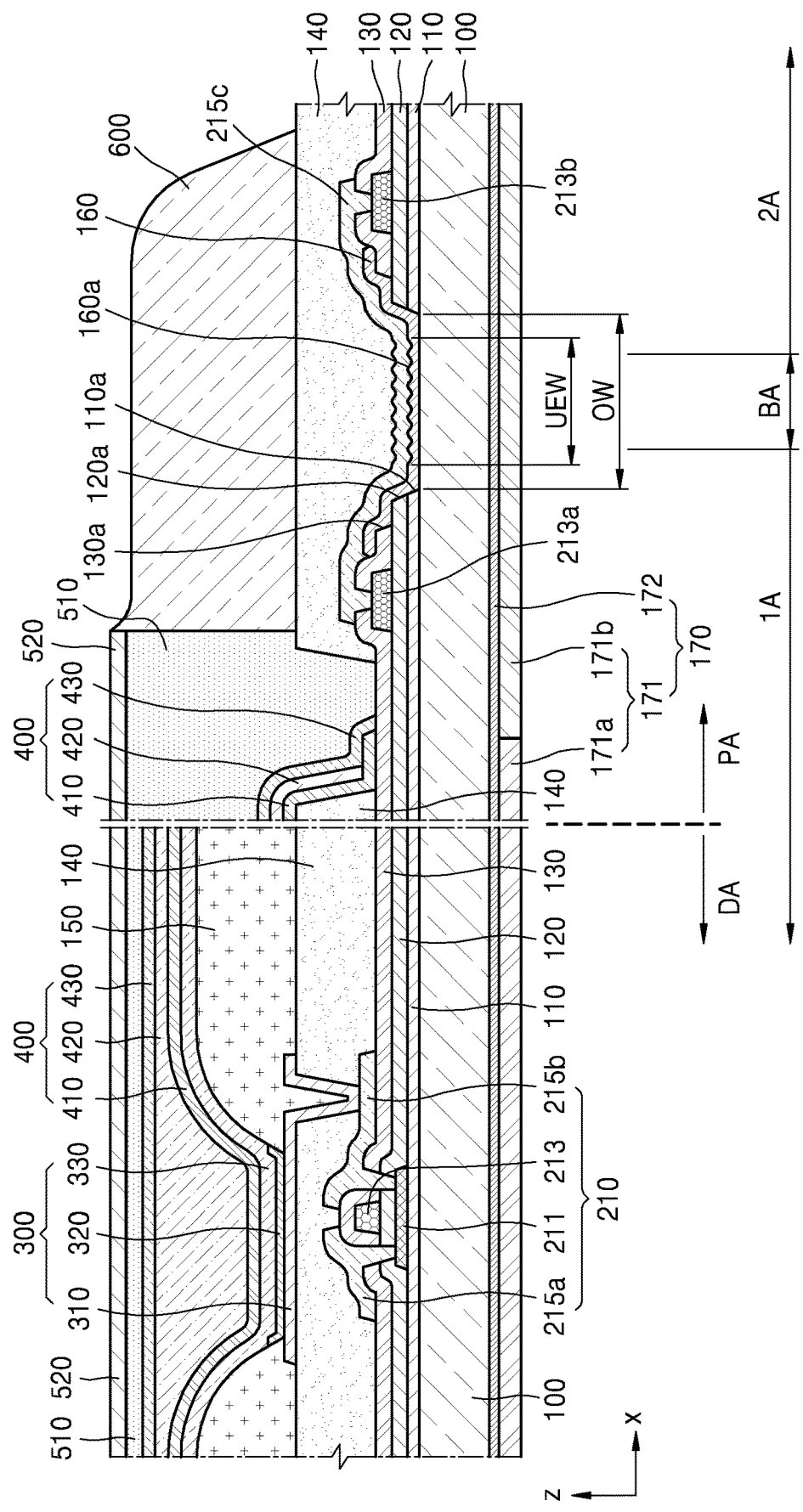
FIG. 20 is a schematic cross-sectional view of a modified part of a display apparatus according to an embodiment.
Figure 22:
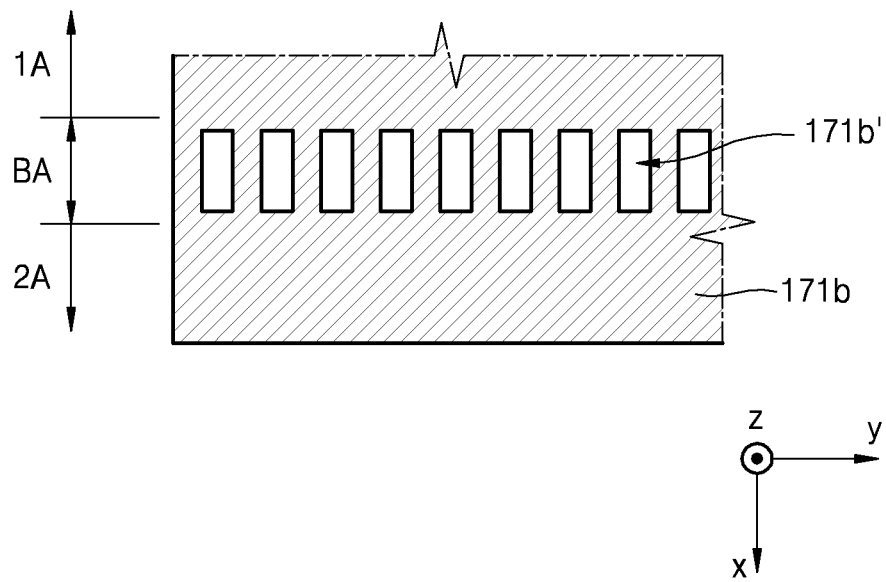
FIG. 22 is a schematic plan view of a part of a protective film included in a display apparatus according to an embodiment.
Figure 23:
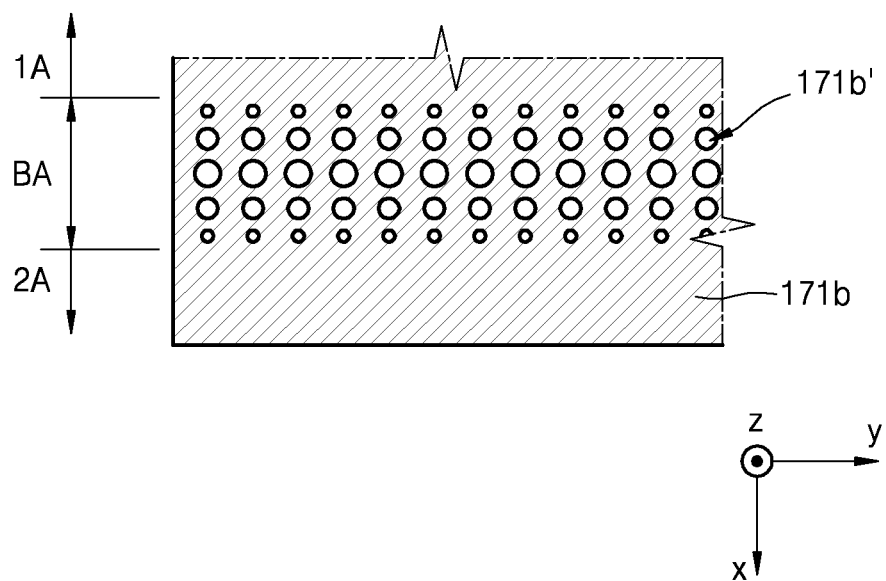
FIG. 23 is a schematic plan view of a part of a protective film included in a display apparatus according to an embodiment.

FIGS. 12 to 19 show that the first protective film base 171a corresponds to the bending area BA, but one or more embodiments are not limited thereto. For example, as shown in FIG. 20, which is a schematic cross-sectional view of a modified example of a display apparatus according to an embodiment, the second protective film base 171b may correspond to the bending area BA and adjacent portions to the bending area BA. In addition, a part of the second protective film base 171b corresponding to the bending area BA may include a plurality of openings or a plurality of grooves. In this case, each of the plurality of openings or each of the plurality of grooves may extend from the display area DA toward the peripheral area PA in a virtual curved surface that is in parallel with the upper surface of the bent substrate 100 as shown in FIG. 22. In addition, as shown in FIG. 23, from among the plurality of openings or the plurality of grooves, the openings or grooves located at the center portion of the bending area BA may each have an area that is greater than that of each of the openings or grooves near the edges of the bending area BA.

In addition, FIGS. 13 to 19 illustrate that the first protective film base 171a includes the plurality of openings 171a', but one or more embodiments are not limited thereto. For example, the first protective film base 171a may be at least partially removed corresponding to the bending area BA, so that one opening or one groove corresponding to the bending area BA may be obtained. As shown in FIG. 20, when the second protective film base 171b corresponds to the bending area BA and an adjacent portion to the bending area BA, the second protective film base 171b may be at least partially removed corresponding to the bending area BA, and thus, one opening or one groove corresponding to the bending area BA may be obtained.

Figure 21:
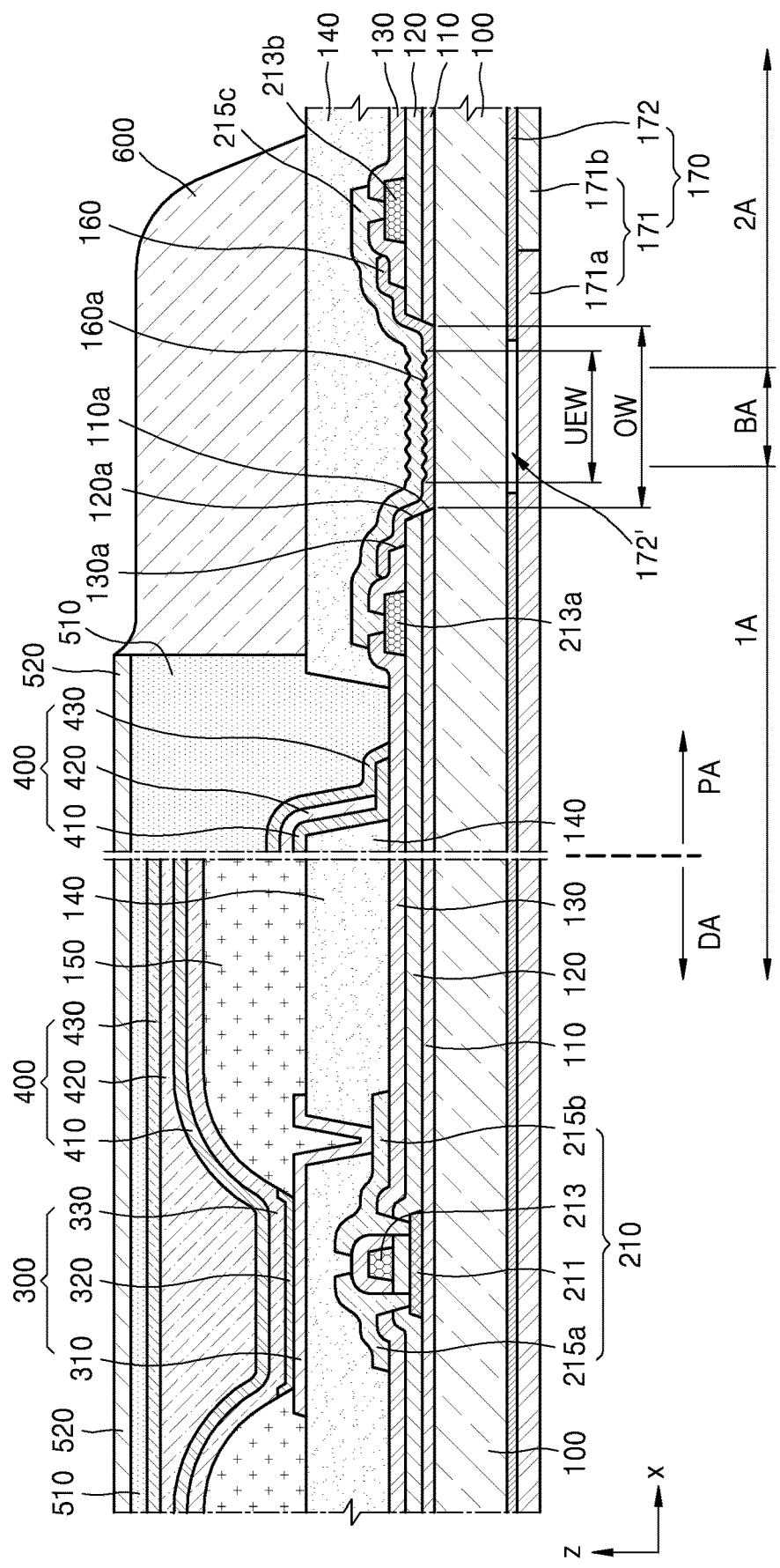
FIG. 21 is a schematic cross-sectional view of a modified part of a display apparatus according to an embodiment.

FIG. 21 is a schematic cross-sectional view of a modified example of a display apparatus according to an embodiment. As shown in FIG. 21, in the display apparatus according to the embodiment, the adhesive layer 172 of the protective film 170 may include an opening 172' corresponding to the bending area BA. In this case, the opening 172' may be filled with air. Otherwise, the protective film base 171 may also include an opening corresponding to the opening 172' of the adhesive layer 172.

A part of the adhesive layer 172 of the protective layer 170 may include a plurality of openings corresponding to the bending area BA. In addition, when the first protective film base 171a corresponds to the bending area BA, the adhesive layer 172 may include a plurality of openings corresponding to the plurality of openings 171a' of the first protective film base 171a, as shown in FIG. 19. This may be understood that the first protective film base 171a includes the plurality of openings 171a' corresponding to the plurality of openings of the adhesive layer 172.

Figure 24:
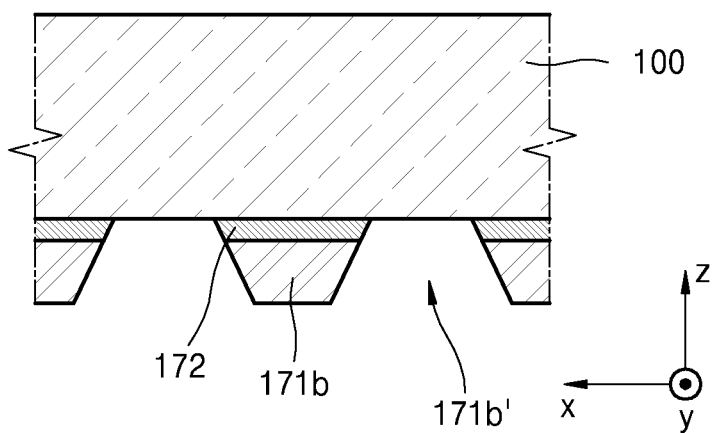
FIG. 24 is a schematic cross-sectional view of a part of the display apparatus according to an embodiment.

When the adhesive layer 172 of the protective film 170 includes the plurality of openings corresponding to the bending area BA, the second protective film base 171b, not the first protective film base 171a, may correspond to the bending area BA. In this case, as shown in FIG. 24, the adhesive layer 172 may also include the plurality of openings corresponding to the plurality of openings of the second protective film base 171b. Also, this may be understood that the second protective film base 171b includes the plurality of openings corresponding to the plurality of openings of the adhesive layer 172.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope as defined by the following claims.

What is claimed is:

1. A display apparatus comprising:
a substrate comprising a first area and a peripheral area outside the first area, the peripheral area comprising a bending area, the substrate being bent at the bending area;
a display unit over an upper surface of the substrate by adhesive;
a protective film comprising a protective film base, the protective film being attached to a lower surface of the substrate,
wherein the protective film base comprises a first protective film base and a second protective film base outside the first protective film base, the first protective film base contacts the first area and the entire bending area by the adhesive, and the second protective film base has a physical property that is different from a physical property of the first protective film base and contacts a part of the peripheral area by the adhesive without overlapping the bending area in a direction the second protective film base directly faces the adhesive, wherein the direction is perpendicular to a surface of the second protective film base that directly faces the adhesive.

2. The display apparatus of claim 1, wherein the second protective film base has a light transmittance that is greater than a light transmittance of the first protective film base.

3. The display apparatus of claim 1, wherein the first protective film base has a thermal resistance that is greater than a thermal resistance of the second protective film base.

4. The display apparatus of claim 3, wherein the first protective film base has a heat deformation temperature that is higher than a heat deformation temperature of the second protective film base.

5. The display apparatus of claim 1, further comprising an electronic device or a printed circuit board over the upper surface of the substrate so as to correspond to an electronic device area included in the peripheral area,
    wherein the second protective film base corresponds at least to the electronic device area.

6. The display apparatus of claim 5, wherein the second protective film base extends to an edge of the substrate facing away from the first area.

7. The display apparatus of claim 5, wherein a first end portion of the first protective film base in a direction to the electronic device area is in surface-contact with a second end portion of the second protective film base in a direction to the first area.

8. The display apparatus of claim 7, wherein the first end portion and the second end portion correspond to an edge of the first area in the direction to the electronic device area.

9. The display apparatus of claim 7, wherein the first end portion and the second end portion correspond to an edge of the electronic device area in the direction to the first area.

10. The display apparatus of claim 5, wherein a first end portion of the first protective film base in a direction to the electronic device area corresponds to an edge of the first area in a direction to the electronic device area.

11. The display apparatus of claim 5, wherein a second end portion of the second protective film base in a direction to the first area corresponds to an edge of the electronic device area in a direction to the first area.

12. The display apparatus of claim 5, wherein a first end portion of the first protective film base in a direction to the electronic device area is spaced apart from a second end portion of the second protective film base in a direction to the first area.

13. The display apparatus of claim 1, wherein a part of the first protective film base corresponding to the bending area is at least partially removed.

14. The display apparatus of claim 1, wherein a part of the first protective film base corresponding to the bending area comprises a plurality of openings or a plurality of grooves.

15. The display apparatus of claim 14, wherein each of the plurality of openings or each of the plurality of grooves extends from the first area toward the peripheral area in a virtual curved surface that is in parallel with the upper surface of the substrate that is bent.

16. The display apparatus of claim 14, wherein, from among the plurality of openings or the plurality of grooves, openings or grooves locating at a center portion of the bending area have areas that are greater than areas of openings or grooves locating near edges of the bending area.

17. The display apparatus of claim 14, wherein inner side surfaces of the plurality of openings or the plurality of grooves are non-perpendicular to the upper surface of the substrate.

18. The display apparatus of claim 14, wherein a portion of the first protective film base includes the plurality of openings or the plurality of grooves, and the portion has an area that is less than an area of the bending area.

19. The display apparatus of claim 14, wherein a portion of the first protective film base includes the plurality of openings or the plurality of grooves, and the portion has an area that is equal to an area of the bending area.

20. The display apparatus of claim 14, wherein a portion of the first protective film base includes the plurality of openings or the plurality of grooves, and the portion has an area that is greater than an area of the bending area.

* * * * *